US011452250B2

(12) United States Patent
Futamura et al.

(10) Patent No.: US 11,452,250 B2
(45) Date of Patent: Sep. 20, 2022

(54) SUBSTRATE INSPECTION DEVICE THAT INSPECTS APPLICATION QUALITY OF ADHESIVE

(71) Applicant: CKD Corporation, Aichi (JP)

(72) Inventors: Ikuo Futamura, Aichi (JP); Tsuyoshi Ohyama, Aichi (JP); Norihiko Sakaida, Aichi (JP)

(73) Assignee: CKD CORPORATION, Aichi (JP)

( * ) Notice: Subject to any disclaimer, the term of this patent is extended or adjusted under 35 U.S.C. 154(b) by 387 days.

(21) Appl. No.: 16/535,563

(22) Filed: Aug. 8, 2019

(65) Prior Publication Data

US 2019/0364707 A1  Nov. 28, 2019

Related U.S. Application Data

(63) Continuation of application No. PCT/JP2017/030146, filed on Aug. 23, 2017.

(30) Foreign Application Priority Data

Feb. 9, 2017  (JP) .............................. JP2017-021781

(51) Int. Cl.
*H05K 13/08* (2006.01)
*G06T 7/11* (2017.01)
(Continued)

(52) U.S. Cl.
CPC .............. *H05K 13/0817* (2018.08); *G01N 21/95684* (2013.01); *G06T 7/0006* (2013.01);
(Continued)

(58) Field of Classification Search
CPC ......... G01B 11/00; G01N 2021/95646; G01N 21/956; G01N 21/95684;
(Continued)

(56) References Cited

U.S. PATENT DOCUMENTS 8,131,061 B2 * 3/2012 Mamiya ................. G06T 7/136
382/150
2007/0205253 A1 9/2007 Hubner
(Continued)

FOREIGN PATENT DOCUMENTS

JP       H8130363 A       5/1996
JP       2002271096 A     9/2002
(Continued)

OTHER PUBLICATIONS

International Preliminary Report on Patentability issued in corresponding International Application No. PCT/JP2017/030146, dated Aug. 22, 2019 with English Translation (12 pages).
International Search Report issued in International Application No. PCT/JP2017/030146, dated Oct. 17, 2017 (5 pages).

*Primary Examiner* — Minh N Trinh
(74) *Attorney, Agent, or Firm* — Osha Bergman Watanabe & Burton LLP

(57) ABSTRACT

A substrate inspection device that is placed on an upstream side of a component mounting machine that mounts an electronic component on solder that is printed on a substrate by a solder printing machine, and that inspects the solder and a thermosetting adhesive applied on the substrate, the substrate inspection device including: an irradiator that irradiates the solder and the adhesive with light; an imaging device that takes an image of the irradiated solder and the irradiated adhesive; and a processor that: generates actual solder position information of a solder group that the electronic component is mounted on based on the image, wherein the solder group includes two or more solders; generates, based on design data or manufacturing data, ideal solder inspection reference information indicating a reference inspection position and/or a reference inspection range of the solder included in the solder group.

11 Claims, 14 Drawing Sheets

(51) Int. Cl.
*G01N 21/956* (2006.01)
*G06T 7/00* (2017.01)
*H05K 3/34* (2006.01)
*H05K 13/04* (2006.01)

(52) U.S. Cl.
CPC .............. *G06T 7/11* (2017.01); *H05K 3/341* (2013.01); *H05K 3/3494* (2013.01); *H05K 13/0469* (2013.01); *G06T 2207/30152* (2013.01); *H05K 2203/163* (2013.01); *H05K 2203/166* (2013.01)

(58) Field of Classification Search
CPC ........... G06T 2207/30141; G06T 2207/30152; G06T 7/0006; G06T 7/11; H05K 13/046; H05K 13/0469; H05K 13/081
See application file for complete search history.

(56) References Cited

U.S. PATENT DOCUMENTS

2011/0249096 A1* 10/2011 Umemura ............ H05K 3/3485
348/46
2019/0364707 A1* 11/2019 Futamura ............. H05K 3/3494

FOREIGN PATENT DOCUMENTS

| JP | 2002328100 A | 11/2002 |
| JP | 2007110170 A | 4/2007 |
| JP | 2009192282 A | 8/2009 |

\* cited by examiner

SUBSTRATE INSPECTION DEVICE THAT INSPECTS APPLICATION QUALITY OF ADHESIVE

BACKGROUND

Technical Field

The present invention relates to a substrate inspection device configured to inspect a substrate, such as a printed circuit board or the like, as well as a substrate inspection method and a method of manufacturing the substrate.

Description of Related Art

A general procedure of mounting electronic components on a printed circuit board first prints solder paste on electrode patterns laid on the printed circuit board. The procedure then temporarily sticks the electronic components on the printed circuit board with the solder paste printed thereon by taking into account the viscosity of the solder paste. A thermosetting adhesive may be applied on the printed circuit board, with a view to preventing the electronic components from dropping off, for example, when the printed circuit board with the electronic components mounted thereon passes through a predetermined reflow furnace. After mounting of the electronic components, the printed circuit board is led to the reflow furnace to be subjected to a predetermined reflow process for soldering. In general, each electronic component has a plurality of electrode portions (electrodes and leads). The respective electrode portions are joined with different pieces of the solder paste. One electronic component is accordingly mounted on each solder group comprised of multiple pieces of the solder paste.

Inspection with regard to the application quality of the adhesive and the printing quality of the solder paste is performed in a stage prior to the reflow process. A known inspection device for performing such inspection uses an inspection algorithm for determining the printing quality of the solder paste, to inspect the application quality of the adhesive (as described in, for example, Patent Literature 1).

A proposed inspection device for inspecting the printing quality of the solder paste takes into account exertion of self-alignment effect in the reflow process. The self-alignment effect is achieved by the function that causes the solder paste molten in the reflow process to wet and spread along the surface of the electrode pattern. A proposed configuration of this type of inspection device offsets a reference position of inspection by a predetermined amount in the unit of each electronic component (in the unit of each solder group) relative to the positions of actually printed solder paste and inspects the printing quality of each piece of the solder paste based on this offset reference position (as described in, for example, Patent Literature 2). This inspection device outputs information with regard to a position offset from a mounting reference position of an electronic component by the predetermined amount, to a component mounting machine, as information with regard to the mounting position of the electronic component.

PATENT LITERATURE

Patent Literature 1: JP 2002-328100A
Patent Literature 2: JP 2009-192282A

When the curing temperature of the adhesive is lower than the melting temperature of the solder paste, the adhesive is cured prior to fusion of the solder paste. This is likely to cause insufficient exertion of the self-alignment effect. Accordingly, outputting the information with regard to the position offset from the mounting reference position of the electronic component by the predetermined amount to the component mounting machine as the information with regard to the mounting position of the electronic component is likely to mount the electronic component at a wrong position.

When the curing temperature of the adhesive is higher than the melting temperature of the solder paste, on the other hand, the self-alignment effect is likely to be exerted. Under the condition that the self-alignment effect is exerted, a technique employable for inspection of the application quality of the adhesive may apply the inspection procedure of the latter inspection device (described in Patent Literature 2) to the inspection procedure of the former inspection device (described in Patent Literature 1). More specifically, this employable technique may offset information with regard to a reference position of inspection by a predetermined amount according to an inspection algorithm used to determine the printing quality of the solder paste and inspect the application quality of the adhesive based on the information with regard to the offset reference position.

While the solder paste and the electronic component are moved by the self-alignment effect, however, the adhesive is generally not moved. Accordingly, the adhesive that is applied at an inappropriate position is not likely to be moved to an appropriate position after the reflow process by the self-alignment effect. Inspection of the application quality of the adhesive based on the information with regard to the offset reference position as described above is thus likely to cause a failure in appropriately inspecting the application quality of the adhesive. For example, even when the inspection result shows "good application quality", the actual application quality of the adhesive may be poor.

SUMMARY

One or more embodiments of the present invention provide a substrate inspection device that is configured to more reliably mount an electronic component at an appropriate position and to appropriate inspect at least the application quality of an adhesive, as well as to provide a substrate inspection method and a method of manufacturing the substrate.

The following describes embodiments of the present invention. Functions and advantageous effects that are characteristic of each of the aspects are also described as appropriate.

Aspect 1. According to one or more embodiments, there is provided a substrate inspection device placed on an upstream side of a component mounting machine, which is used to mount an electronic component on solder printed on a substrate by a solder printing machine, and configured to inspect a thermosetting adhesive applied on the substrate and the solder. The substrate inspection device comprises an irradiation unit configured to irradiate at least the solder and the adhesive with light; an imaging unit configured to take an image of at least the solder and the adhesive irradiated with the light; an actual solder position information generating unit configured to generate actual solder position information that is position information of a solder group, which includes two or more solders and which the electronic component is mounted on, based on image data taken by the imaging unit; an ideal solder inspection reference information generating unit configured to generate ideal solder inspection reference information, which indicates a reference inspection position and/or a reference inspection range of the solder included in the solder group, based on design data or manufacturing data; and an ideal adhesive inspection reference information generating unit configured to generate ideal adhesive inspection reference information, which indicates a reference inspection position and/or a reference inspection range of the adhesive, based on the design data or the manufacturing data.

The adhesive has a curing temperature that is set to be higher than a melting temperature of the solder.

Information based on an amount of positional misalignment and a direction of positional misalignment of the actual solder position information relative to ideal solder position information, which indicates a position of the solder group on the design data or on the manufacturing data, is output to the component mounting machine, as mounting position adjustment information that indicates an amount of positional misalignment and a direction of positional misalignment of expected mounting position information indicating an expected mounting position of the electronic component, relative to ideal mounting position information, which indicates an ideal mounting position of the electronic component that is to be mounted on the solder group.

Inspection of each of the solders included in the solder group is performed based on actual inspection reference information obtained by shifting the ideal solder inspection reference information by the mounting position adjustment information, and inspection of the adhesive is performed based on the ideal adhesive inspection reference information.

The "(actual or ideal) solder position information" shows a relative position of a solder group to a substrate and may be, for example, the center or the center of gravity of a region (=solder region) occupied by each of the solders included in the solder group on the substrate, the center or the center of gravity of a rectangle circumscribing the solder region, or a midpoint or the center of gravity of the respective solder regions (for example, a midpoint or the center of gravity of the centers or the centers of gravity of the respective solder regions).

The "ideal mounting position information" shows an ideal mounting position of an electronic component, which is generated based on, for example, solder positions on the data. This information may be, for example, ideal solder position information itself or the midpoint or the center of gravity of the respective solder regions.

The "expected mounting position information" shows an expected mounting position of an electronic component, which is generated based on actually printed solders. This information may be, for example, actual solder position information itself or the midpoint or the center of gravity of the respective solder regions.

The "ideal solder inspection reference information" shows an inspection position or an inspection range of each solder on the data. This information may be, for example, ideal solder position information, an inspection window (ideal solder inspection window) generated based on a region on the data occupied by the solder (ideal solder region), or the center or the center of gravity of the solder region on the data.

The "ideal adhesive inspection reference information" shows an inspection position or an inspection range of the adhesive on the data. This information may be, for example, information with regard to an application position of the adhesive on the data (ideal adhesive position information), an inspection window (ideal adhesive inspection window) generated based on a region on the data occupied by the adhesive (ideal adhesive region), or the center or the center of gravity of an adhesive region on the data.

The "mounting position adjustment information" is information indicating the degrees of an amount of positional misalignment and a direction of positional misalignment with regard to an actually printed solder group relative to a solder group on the data and may be expressed by, for example, vector information or rotation angle information.

The "actual inspection reference information" is information indicating an inspection reference position and an inspection reference range of each actually printed solder. This information may be, for example, information obtained by shifting the ideal solder inspection reference information (e.g., coordinate information or an inspection window) by a predetermined vector component or may be information obtained by rotating the ideal solder inspection reference information (e.g., coordinate information or an inspection window) by a predetermined rotation angle.

According to the configuration of the aspect 1 described above, the adhesive has the curing temperature set to be higher than the melting temperature of the solder. This allows for exertion of self-alignment effect.

The configuration of the above aspect 1 then outputs the information based on the amount of positional misalignment and the direction of positional misalignment of the actual solder position information relative to the ideal solder position information, to the component mounting machine, as the mounting position adjustment information. This configuration accordingly enables an electronic component to be placed at a position determined by taking into account the self-alignment effect and more reliably mounts the electronic component at an appropriate position. This configuration utilizes the information that is generated in an inspection process, for a mounting process. There is accordingly no need to perform a series of processing, which is similar to that performed in the inspection process, in a duplicated manner in the mounting process. This improves the manufacturing efficiency.

Even under the condition of exertion of the self-alignment effect, on the other hand, the configuration of the above aspect 1 performs inspection of the adhesive, based on the ideal adhesive inspection reference information. By taking into account the fact that the adhesive is not moved even under the condition of exertion of the self-alignment effect, inspection of the application quality of the adhesive is performed, based on the position and the region of the adhesive on the design data or on the manufacturing data (an ideal position and an ideal region of the adhesive on an eventually produced substrate). This configuration accordingly enables the application quality of the adhesive to be appropriately inspected. As a result, this configuration prevents, for example, an electronic component from being mounted on the substrate where the adhesive is not appropriately applied, thus enhancing the yield and suppressing an increase in the manufacturing cost.

While inspection of the adhesive is performed based on the ideal adhesive inspection reference information as described above, inspection of each of the solders included in a solder group which an electronic component is mounted on is performed based on an inspection reference position (actual inspection reference information) obtained by shifting an inspection reference position of the solder in an ideal printing state (ideal solder inspection reference information) by the mounting position adjustment information. Accordingly, by taking into account the condition that the self-alignment effect is likely to exerted, the configuration of the aspect 1 changes a reference position of inspection in the unit of each electronic component (in the unit of each solder group), based on the positions of actually printed solders, and performs inspection of each of the solders, based on this changed reference position. Accordingly, for example, when the respective solders included in the solder group have relatively large amounts of positional misalignment but the amounts of positional misalignment and the directions of positional misalignment are approximately fixed and it is expected to place the solders and the like at appropriate positions by the self-alignment effect, this may make a determination of "good printing quality". In another example, when the individual solders have relatively small amounts of positional misalignment but the individual solders have varying directions of positional misalignment and it is unlikely to mount an electronic component appropriately, on the other hand, this may result in significantly deviating a certain solder from the reference position of inspection and may thus make a determination of "poor printing quality". As described above, the configuration of the above aspect 1 enables the printing quality of the solder to be appropriately inspected by taking into account the self-alignment effect. In combination with the appropriate inspection of the application quality of the adhesive, this configuration more effectively enhances the yield and suppresses an increase in the manufacturing cost.

Aspect 2. According to one or more embodiments, there is provided a substrate inspection device placed on an upstream side of a component mounting machine, which is used to mount an electronic component on solder printed on a substrate by a solder printing machine, and configured to inspect at least a thermosetting adhesive applied on the substrate, out of the adhesive and the solder. The substrate inspection device comprises an irradiation unit configured to irradiate at least the solder and the adhesive with light; an imaging unit configured to take an image of at least the solder and the adhesive irradiated with the light; an actual solder position information generating unit configured to generate actual solder position information that is position information of a solder group, which includes two or more solders and which the electronic component is mounted on, based on image data taken by the imaging unit; and an ideal adhesive inspection reference information generating unit configured to generate ideal adhesive inspection reference information, which indicates a reference inspection position and/or a reference inspection range of the adhesive, based on design data or manufacturing data.

The adhesive has a curing temperature that is set to be higher than a melting temperature of the solder.

Information based on an amount of positional misalignment and a direction of positional misalignment of the actual solder position information relative to ideal solder position information, which indicates a position of the solder group on the design data or on the manufacturing data, is output to the component mounting machine, as mounting position adjustment information that indicates an amount of positional misalignment and a direction of positional misalignment of expected mounting position information indicating an expected mounting position of the electronic component, relative to ideal mounting position information, which indicates an ideal mounting position of the electronic component that is to be mounted on the solder group.

Inspection of at least the adhesive is performed, based on the ideal adhesive inspection reference information.

According to the configuration of the aspect 2 described above, the adhesive has the curing temperature set to be higher than the melting temperature of the solder. This allows for exertion of self-alignment effect.

The configuration of the above aspect 1 then outputs the information based on the amount of positional misalignment and the direction of positional misalignment of the actual solder position information relative to the ideal solder position information to the component mounting machine, as the mounting position adjustment information. This configuration accordingly enables an electronic component to be placed at a position determined by taking into account the self-alignment effect and more reliably mounts the electronic component at an appropriate position. This configuration utilizes the information that is generated in an inspection process, for a mounting process. There is accordingly no need to perform a series of processing, which is similar to that performed in the inspection process, in a duplicated manner in the mounting process. This improves the manufacturing efficiency.

Even under the condition of exertion of the self-alignment effect, on the other hand, the configuration of the above aspect 2 performs inspection of at least the adhesive, based on the ideal adhesive inspection reference information. By taking into account the fact that the adhesive is not moved even under the condition of exertion of the self-alignment effect, inspection of the application quality of the adhesive is performed, based on the position and the region of the adhesive on the design data or on the manufacturing data (an ideal position and an ideal region of the adhesive on an eventually produced substrate). This configuration accordingly enables the application quality of the adhesive to be appropriately inspected. As a result, this configuration prevents, for example, an electronic component from being mounted on the substrate where the adhesive is not appropriately applied, thus enhancing the yield and suppressing an increase in the manufacturing cost.

Aspect 3. According to one or more embodiments, in the substrate inspection device described in either the above aspect 1 or the above aspect 2, the adhesive may be an insulating adhesive. The substrate inspection device may calculate an area of an overlap region between the solder printed on the substrate and the adhesive applied on the substrate and may determine successful/failed soldering based on the calculated area, prior to a predetermined reflow process.

Even in the case where the adhesive, the solders and the electronic component are placed at appropriate positions by the self-alignment effect after the reflow process, adhesion of a large amount of the insulating adhesive to the solder prior to the reflow process is likely to cause insufficient electrical continuity via the solder and is thus likely to provide failed soldering.

The configuration of the above aspect 3, however, determines successful/failed soldering, based on an overlap area between the adhesive and the solder (i.e., the area of an overlap region between the adhesive and the solder in a planar view of the adhesive and the solder). Accordingly, this configuration enables the actual failed soldering to be appropriately grasped after the reflow process, even when the solder, the electronic component and the like apparently seem to be placed at appropriate positions. This configuration enhances the inspection accuracy.

Aspect 4. According to one or more embodiments, in the substrate inspection device described in any of the above aspects 1 to 3, the adhesive may be an insulating adhesive. The substrate inspection device may calculate an area of an overlap region between an expected placement region of an electrode portion of the electronic component that is to be mounted on the solder, and the adhesive applied on the substrate and may determine successful/failed soldering based on the calculated area, prior to a predetermined reflow process.

The "electrode portion" denotes an electrically conductive member placed on solder and is, for example, an electrode and a lead.

Even in the case where the adhesive, the solders and the electronic component are placed at appropriate positions by the self-alignment effect after the reflow process, adhesion of a large amount of the insulating adhesive to the solder prior to the reflow process is likely to cause insufficient electrical continuity via the solder and is thus likely to provide failed soldering.

The configuration of the above aspect 4, however, determines successful/failed soldering, based on an overlap area between the insulating adhesive and the expected placement region of the electrode portion (i.e., the area of an overlap region between the adhesive and the expected placement region of the electrode portion in a planar view of the adhesive and the expected placement region of the electrode portion). Accordingly, this configuration enables the actual failed soldering to be appropriately grasped after the reflow process, even when the solder, the electronic component and the like apparently seem to be placed at appropriate positions. This configuration further enhances the inspection accuracy.

Aspect 5. According to one or more embodiments, there is provided a substrate inspection method that inspects at least a thermosetting adhesive applied on a substrate, out of the adhesive and solder printed on the substrate in a stage prior to mounting an electronic component on the solder. The substrate inspection method comprises an irradiation process of irradiating at least the solder and the adhesive with light; an imaging process of taking an image of at least the solder and the adhesive irradiated with the light; an actual solder position information generating process of generating actual solder position information that is position information of a solder group, which includes two or more solders and which the electronic component is mounted on, based on image data taken in the imaging process; and an ideal adhesive inspection reference information generating process of generating ideal adhesive inspection reference information, which indicates a reference inspection position and/or a reference inspection range of the adhesive, based on design data or manufacturing data.

The adhesive has a curing temperature that is set to be higher than a melting temperature of the solder.

The substrate inspection method comprises outputting information based on an amount of positional misalignment and a direction of positional misalignment of the actual solder position information relative to ideal solder position information, which indicates a position of the solder group on the design data or on the manufacturing data, to a component mounting machine that is used to mount the electronic component, as mounting position adjustment information that indicates an amount of positional misalignment and a direction of positional misalignment of expected mounting position information indicating an expected mounting position of the electronic component, relative to ideal mounting position information, which indicates an ideal mounting position of the electronic component that is to be mounted on the solder group; and performing inspection of at least the adhesive, based on the ideal adhesive inspection reference information.

Aspect 6. According to one or more embodiments, there is provided a method of manufacturing a substrate. The manufacturing method comprises a solder printing process of printing solder on a substrate; an adhesive applying process of applying an adhesive on the substrate; a substrate inspection process of inspecting at least the adhesive by using the substrate inspection method described in the above aspect 5; a component mounting process of mounting an electronic component on the substrate after the inspection; and a reflow process of heating and melting the solder, as well as heating and curing the adhesive.

DETAILED DESCRIPTION

Figure 1:
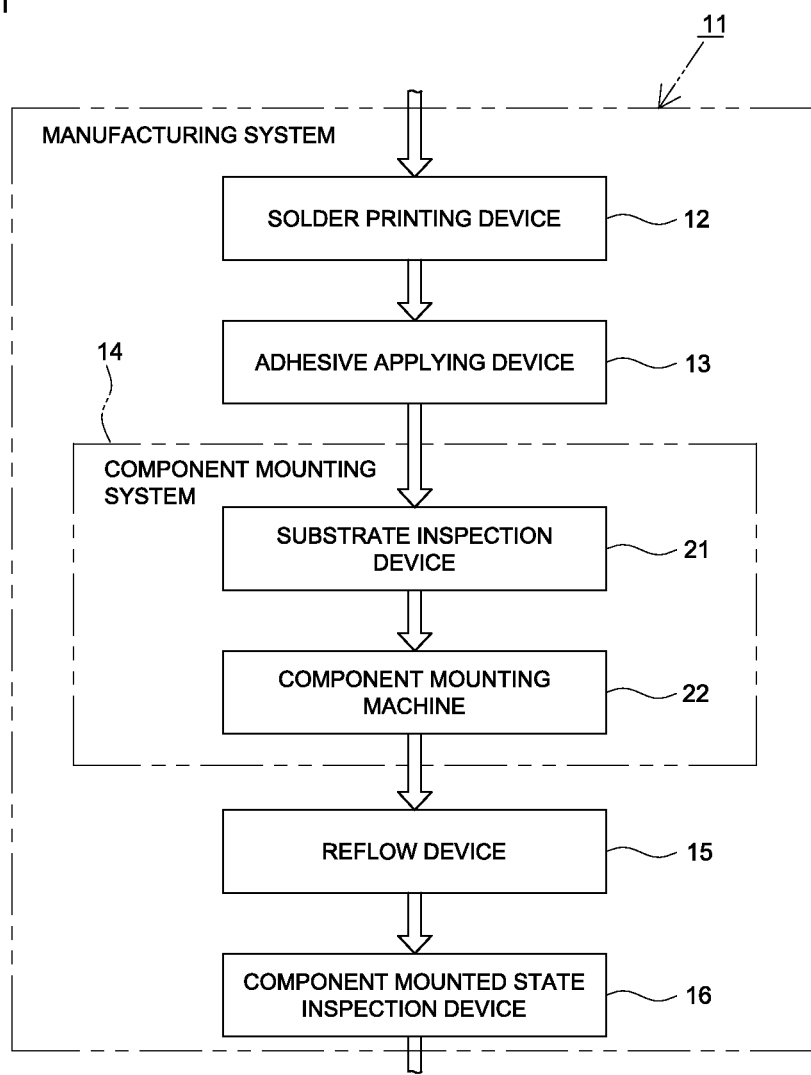
FIG. 1 is a block diagram illustrating the schematic configuration of a manufacturing system according to one or more embodiments.
Figure 2:
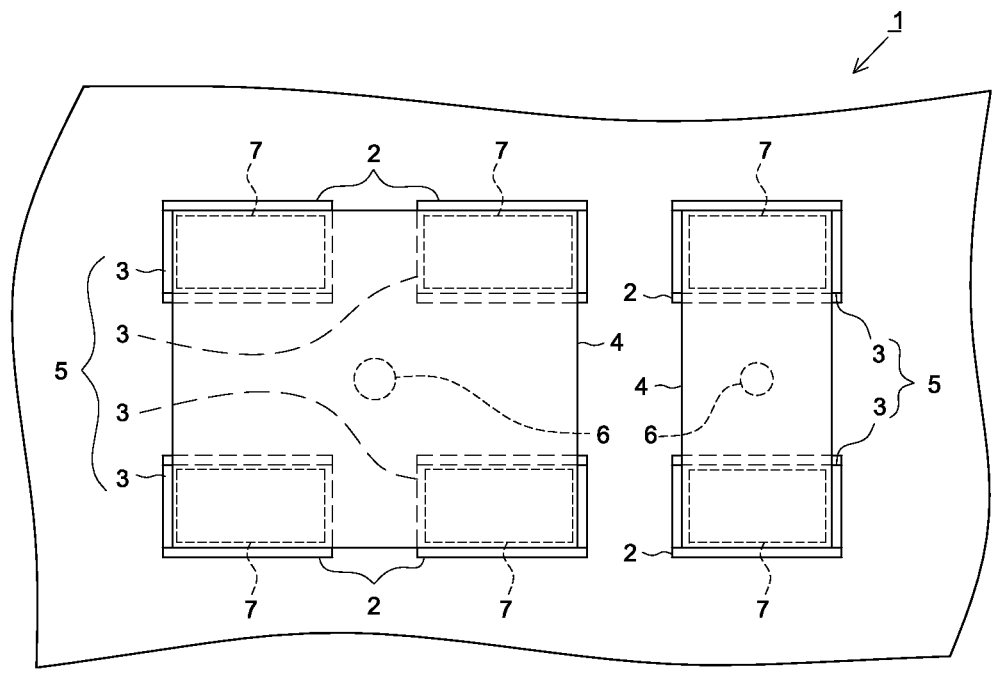
FIG. 2 is a partly enlarged plan view illustrating the schematic configuration of a printed circuit board according to one or more embodiments.
Figure 3:
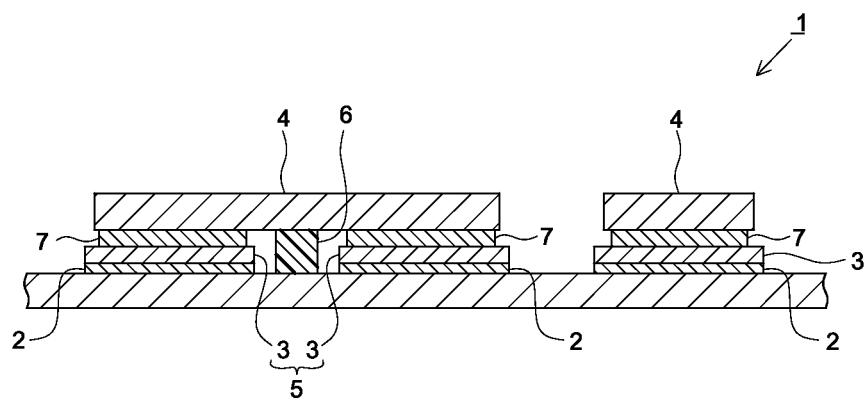
FIG. 3 is a partly enlarged sectional view illustrating the schematic configuration of the printed circuit board according to one or more embodiments.

The following describes embodiments of the present invention with reference to drawings. FIG. 1 is a block diagram illustrating the schematic configuration of a manufacturing system to manufacture a printed circuit board (hereinafter referred to as "substrate"). FIG. 2 is a partly enlarged plan view illustrating part of the substrate 1. FIG. 3 is a partly enlarged sectional view illustrating part of the substrate 1.

The configuration of the substrate 1 is described first. As shown in FIG. 2 and FIG. 3, the substrate 1 has a plurality of electrode patterns 2 having electrical conductivity. Solder paste having viscosity (hereinafter referred to as "solder") 3 is printed on the electrode patterns 2.

The solder 3 used may be, for example, an Sn—Ag-based solder such as Sn-3.0 Ag-0.5 Cu or Sn-0.3 Ag-0.7 Cu, an Sn—Cu-based solder such as Sn-0.7 Cu, an Sn—Zn-based solder such as Sn-8 Zn-3 Bi, or an Sn—Pb-based solder such as Sn 67%-Pb 37%.

For reference, the melting temperature (melting point) of the solder 3 made of Sn-3.0 Ag-0.5 Cu or Sn-0.3 Ag-0.7 Cu is about 217° C., and the melting temperature (melting point) of the solder 3 made of Sn-0.7 Cu is about 227° C. The melting temperature (melting point) of the solder 3 made of Sn-8 Zn-3 Bi is about 187 to 196° C., and the melting temperature (melting point) of the solder 3 made of Sn 67%-Pb 37% is about 183° C.

Electronic components 4 such as a chip or the like are mounted on the solders 3. More specifically, the electronic component 4 includes a plurality of electrode portions 7 comprised of electrodes and leads. Each of the electrode portions 7 is joined with each predetermined solder 3. Accordingly, the electronic component 4 is mounted on one solder group 5 consisting of a plurality of the solders 3.

Additionally, the electronic component 4 is fixed by the solders 3. According to one or more embodiments, with a view to enhancing the fixation, the electronic component 4 is bonded by means of an adhesive 6 applied on the substrate 1. The adhesive 6 is an insulating adhesive having thermosetting property. The adhesive 6 has a curing temperature that is higher than the melting temperature of the solder 3.

The following describes a manufacturing system 11 configured to manufacture the substrate 1. As shown in FIG. 1, the manufacturing system 11 of one or more embodiments includes a solder printing device 12 as a solder printing machine, an adhesive applying device 13, a component mounting system 14, a reflow device 15 and a component mounted state inspection device 16, which are arranged along a transfer line of the substrate 1 sequentially from an upstream side (upper side of the drawing).

The solder printing device 12 is configured to print a predetermined amount of the solder 3 at a predetermined position of the substrate 1 (for example, on the electrode pattern 2). More specifically, the solder printing device 12 is provided with a metal screen (not shown) having a plurality of holes at positions corresponding to the electrode patterns 2 on the substrate 1. The solder printing device 12 uses this metal screen to screen-print the solder 3 on the substrate 1.

The adhesive applying device 13 is configured to apply a predetermined amount of the adhesive 6 at a predetermined position of the substrate 1 (for example, at a position where an electronic component 4 is expected to be placed). The adhesive applying device 13 is provided with, for example, a nozzle head (not shown) configured to be movable in an X-Y direction and ejects the adhesive 6 from this nozzle head to apply the adhesive 6 onto the substrate 1.

The component mounting system 14 includes a substrate inspection device 21 configured to inspect the printed solder 3 and the applied adhesive 6 and a component mounting machine 22 configured to mount the electronic components 4. The substrate inspection device 21 and the component mounting machine 22 will be described later in detail.

The reflow device 15 is configured to heat and melt the solder 3, as well as to heat and cure the adhesive 6. In the substrate 1 after a reflow process performed by the reflow device 15, the electrode portions 7 of the electronic components 4 are joined with the electrode patterns 2 by means of the solders 3, and the electronic component 4 is securely fixed by the adhesive 6.

The component mounted state inspection device 16 is configured to inspect whether each of the electronic components 4 is mounted at a predetermined position and to inspect whether the electrical continuity to each of the electronic components 4 is appropriately ensured The following describes the component mounting system 14. The substrate inspection device 21 is described first.

Figure 4:
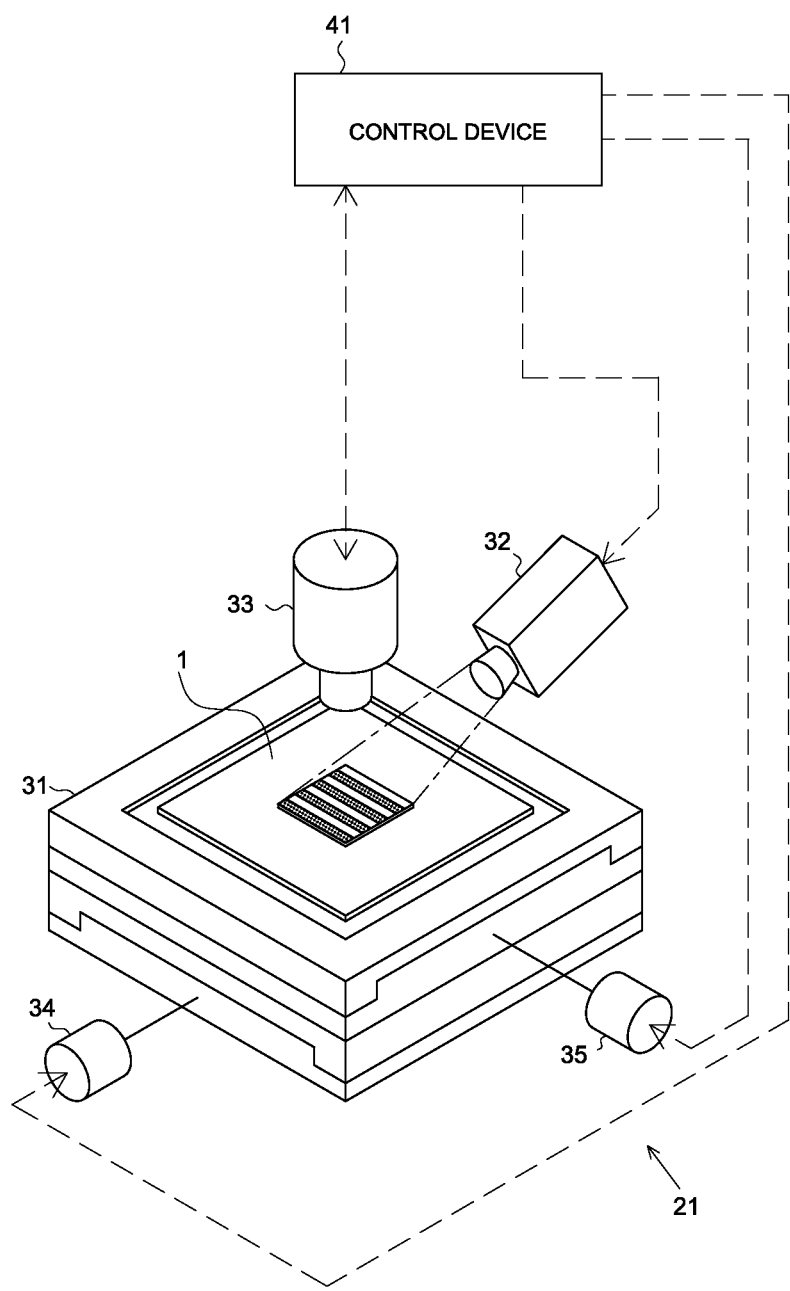
FIG. 4 is a schematic diagram illustrating the schematic configuration of a substrate inspection device and the like according to one or more embodiments.

As shown in FIG. 4, the substrate inspection device 21 includes a mounting table 31 configured such that the substrate 1 is placed on the mounting table 31; an illumination device 32 configured as the irradiation unit to irradiate the surface of the substrate 1 obliquely downward with light; a CCD camera 33 configured as the imaging unit (imaging device) to take an image of the substrate 1 irradiated with the light; and a control device (processor) 41 configured to perform various controls, image processing, arithmetic processing in the substrate inspection device 21.

The mounting table 31 is provided with motors 34 and 35 that respectively have rotating shafts arranged to be orthogonal to each other. The control device 41 drives and controls these motors 34 and 35, such as to slidably move the substrate 1 placed on the mounting table 31 in an arbitrary direction (X-axis direction and Y-axis direction). This changes an imaging site of the substrate 1 by the CCD camera 33.

The illumination device 32 is configured to irradiate the substrate 1 with predetermined light and to radiate light to at least the solder 3 and the adhesive 6.

The CCD camera 33 has sensitivity to a wavelength range of the light radiated from the illumination device 32 and is configured to take an image of at least the solder 3 and the adhesive 6 irradiated with the light. Image data taken by the CCD camera 33 is transferred to an arithmetic device 43 of the control device 41 described later. According to one or more embodiments, the image data transferred is luminance data with regard to reflected light from the substrate 1. The image data transferred is, however, not limited to the luminance data but may be color data, height data or the like of the substrate 1.

Figure 5:
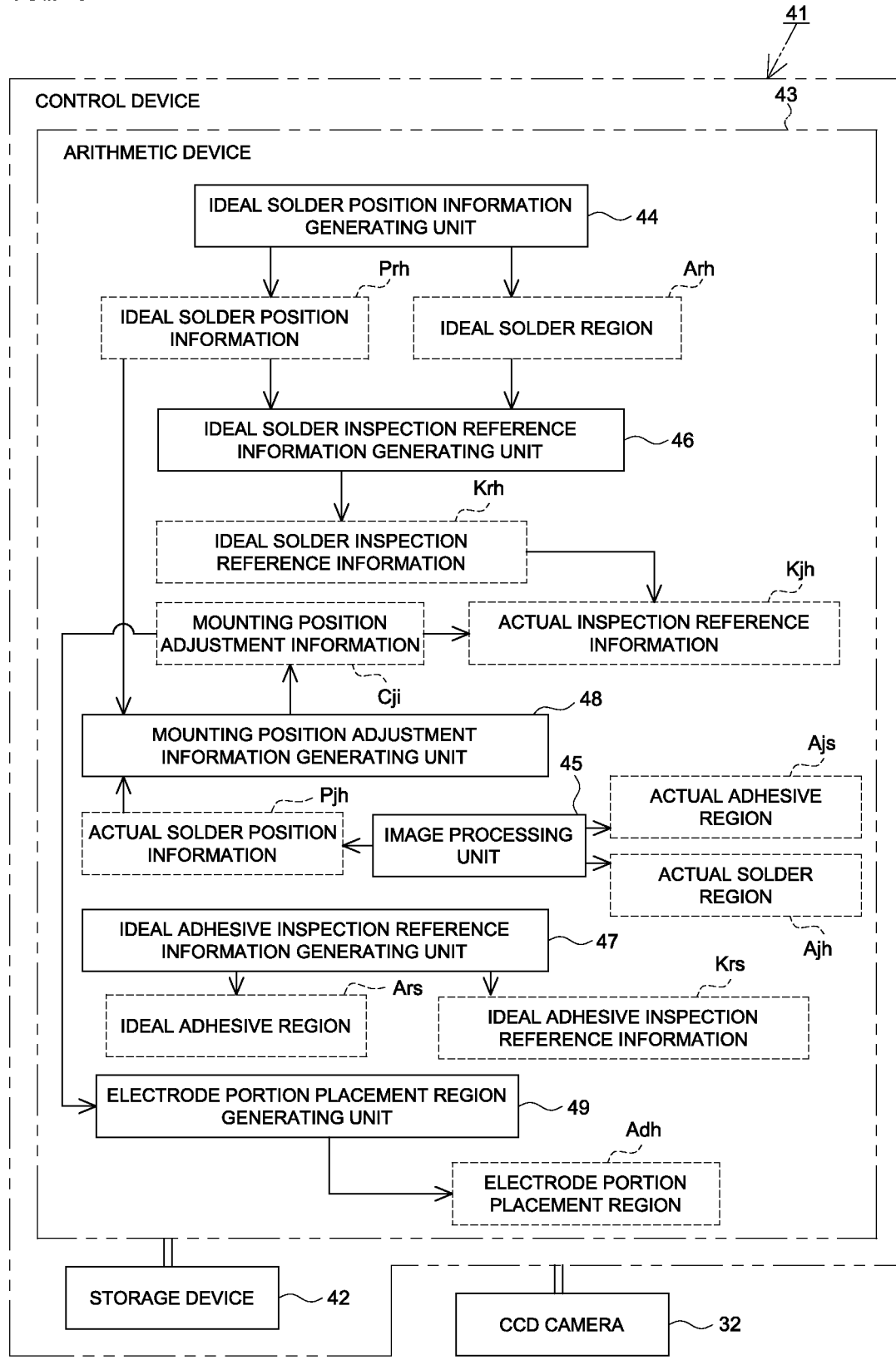
FIG. 5 is a block diagram illustrating the configuration of a control device and the like according to one or more embodiments.

The following describes the control device 41. As shown in FIG. 5, the control device 41 includes a storage device 42 configured to store various data and an arithmetic device 43 configured to perform various arithmetic operations. FIG. 5 illustrates regions and pieces of information provided by respective units 44 to 49 described later, as well as the respective components of the control device 41. These regions and pieces of information are shown by dotted-line boxes in FIG. 5.

The storage device 42 stores results of calculations performed by the arithmetic device 43, as well as design data, manufacturing data and the like with regard to the substrate 1. According to one or more embodiments, the storage device 42 stores, for example, the positions and the sizes of the electrode patterns 2 on the substrate 1, the expected printing positions of the solders 3, the sizes of the solders 3 (for example, the length of each side of each solder 3, the area and the contour length of the solder 3, the length of the diagonal of the solder 3, the volume of the solder 3 and the like) in an ideal printing state, the expected application positions of the adhesives 6, the sizes of the adhesives 6 (for example, the area, the contour length, the volume and the like of each adhesive 6) in an ideal application state, various pieces of information with regard to the electronic components 4 including the sizes of the electrode portions 7 and the expected placement region of each of the electronic components 4, and the size of the substrate 1, as the design data and the manufacturing data. The storage device 42 also stores, for example, information regarding which solder 3 is used to mount each of the electronic components 4 and information regarding which solder 3 is included in which solder group 5.

The arithmetic device 43 includes an ideal solder position information generating unit 44, an image processing unit 45, an ideal solder inspection reference information generating unit 46, an ideal adhesive inspection reference information generating unit 47, a mounting position adjustment information generating unit 48, and an electrode portion placement region generating unit 49.

The ideal solder position information generating unit 44 is configured to generate ideal solder position information Prh that indicates an ideal position of each solder group 5 on the design data or on the manufacturing data stored in the storage device 42. According to one or more embodiments, the ideal solder position information generating unit 44 first obtains an ideal solder region Arh of each of the solders 3 included in each solder group 5, based on the data stored in the storage device 42. According to one or more embodiments, the ideal solder region Arh denotes a planar region on the data that is occupied by each of the solders 3 on the substrate 1.

The ideal solder position information generating unit 44 subsequently obtains the center of gravity coordinates with regard to each of the ideal solder regions Arh. When the solder group 5 includes two solders 3, the ideal solder position information generating unit 44 generates center coordinates (i.e., midpoint coordinates) [=(Lx, Ly)] of the two center of gravity coordinates with regard to these two ideal solder regions Arh, as the ideal solder position information Prh. When the solder group 5 includes three or more solders 3, on the other hand, the ideal solder position information generating unit 44 generates center coordinates (i.e., center of gravity coordinates) [=(Lx, Ly)] of the respective center of gravity coordinates with regard to the respective ideal solder regions Arh, as the ideal solder position information Prh.

A three-dimensional region or the like on the data that is occupied by each of the solders 3 on the substrate 1 may also be obtained as the ideal solder region Arh. The center of each ideal solder region Arh, the center of gravity or the center of a rectangle circumscribing each ideal solder region Arh or the like may also be generated as the ideal solder position information Prh. According to one or more embodiments, the ideal solder region Arh is set to be identical with a region occupied by each electrode pattern 2 on the substrate 1.

The image processing unit 45 is configured to extract an actual solder region Ajh and an actual adhesive region Ajs, based on the image data taken by the CCD camera 33 and to generate actual solder position information Pjh, based on the extracted actual solder region Ajh.

The actual solder region Ajh basically denotes a region of image data that is occupied by each of the solders 3. The solder 3 having a significant defect of the printing quality is, however, not extracted as the actual solder region Ajh. The actual adhesive region Ajs denotes a region of image data occupied by the adhesive 6. Additionally, the actual solder position information Pjh denotes position information of image data with regard to each solder group 5 actually printed.

The extraction of the actual solder region Ajh is described more. The image processing unit 45 first performs a binarization process of the image data using a predetermined luminance value that is set in advance as a reference value and thereby extracts a planar region occupied by each of the solders 3 on the substrate 1. The image processing unit 45 then stores information with regard to the extracted planar region of each of the solders 3 into the storage device 42.

The image processing unit 45 subsequently sets a predetermined solder search region. The solder search region has a shape similar to the shape of each of the ideal solder regions Arh and has center coordinates that are identical with the center coordinates of the ideal solder region Arh. The solder search region is, however, set to be slightly larger than the ideal solder region Arh.

The image processing unit 45 subsequently uses the information with regard to the planar region of each of the solders 3 stored in the storage device 42 and determines whether the area of the planar region of the solder 3 that is present in the solder search region occupies a predetermined or higher ratio of the area of the solder search region. When this determination condition is satisfied, the image processing unit 45 extracts the solder 3 that is present in the solder search region, as a solder bump. A planar region of less than a predetermined area (for example, less than 1% of the area of the solder search region) in the planar region of the solder 3 that is present in the solder search region is, however, not extracted as part of a solder bump.

The image processing unit 45 then extracts a solder region to be linked with the extracted solder bump (i.e., a solder region including the extracted solder bump) as the actual solder region Ajh, based on the information regarding the planar region of the solder 3 stored in the storage device 42. This extracts the actual solder region Ajh with regard to each of the solders 3 included in the solder group 5, except the solder 3 having a significant defect of the printing quality.

When the area of the planar region of the solder 3 that is present in the solder search region is less than the predetermined ratio of the area of the solder search region, on the other hand, the image processing unit 45 does not extract this solder 3 as a solder bump but outputs a "printing failure signal" to the component mounting machine 22. This process is performed, since printing the solder 3 at a position significantly deviated from its ideal printing position is likely to cause difficulty in correcting the position of the solder 3 later even when the self-alignment effect is exerted. The operations of the component mounting machine 22 in response to the input of the "printing failure signal" will be described later.

When a plurality of planar regions of the solder 3, each having a predetermined or larger area (for example, 20% or higher percentage of the area of the solder search region), are present in the solder search region, The image processing unit 45 does not extract this solder as a solder bump but outputs the "printing failure signal" to the component mounting machine 22. This process is performed since the solder 3 is likely to be excessively close to an adjacent solder 3 due to "bleeding" or the like or the solder 3 is likely to blur.

The following describes generation of the actual solder position information Pjh. The image processing unit 45 first determines the center of gravity coordinates with regard to each of the actual solder regions Ajh included in each solder group 5. When the solder group 5 includes two solders 3, the image processing unit 45 generates center coordinates (i.e., midpoint coordinates) [=(x, y)] of the two center of gravity coordinates with regard to these two actual solder regions Ajh included in the solder group 5, as the actual solder position information Pjh. When the solder group 5 includes three or more solders 3, on the other hand, the image processing unit 45 generates center coordinates (i.e., center of gravity coordinates) [=(x, y)] of the respective center of gravity coordinates with regard to the plurality of actual solder regions Ajh included in the, as the actual solder position information Pjh. According to one or more embodiments, the image processing unit 45 corresponds to the actual solder position information generating unit.

For example, the center coordinates (center of gravity coordinates) of each actual solder region Ajh, the center of gravity or the center of a rectangle circumscribing each actual solder region Ajh or the like may be generated as the actual solder position information Pjh. The actual solder position information Pjh, however, needs to be an identical type with the type of (i.e., to have identical types of category and parameters with those of) the ideal solder position information Prh. According to one or more embodiments, as described above, the center coordinates of the center of gravity coordinates of the ideal solder region Arh are generated as the ideal solder position information Prh, and the center coordinates of the center of gravity coordinates of the actual solder region Ajh are generated as the actual solder position information Pjh.

The following describes extraction of the actual adhesive region Ajs. The image processing unit 45 first performs a binarization process of the image data using a predetermined luminance value that is set in advance as a reference value and thereby extracts a planar region occupied by the adhesive 6 on the substrate 1. The image processing unit 45 then specifies the extracted planar region as the actual adhesive region Ajs.

The ideal solder inspection reference information generating unit 46 is configured to generate ideal solder inspection reference information Krh that indicates an inspection range corresponding to the ideal solder region Arh. According to one or more embodiments, the ideal solder inspection reference information generating unit 46 generates the ideal solder inspection reference information Krh, based on the ideal solder region Arh obtained by the ideal solder position information generating unit 44.

More specifically, the ideal solder inspection reference information generating unit 46 generates an ideal solder inspection window that has a similar shape to the shape of the ideal solder region Arh and that has center coordinates identical with the center coordinates of the ideal solder region Arh, as the ideal solder inspection reference information Krh. This ideal solder inspection window indicates an inspection reference range of each solder 3 included in the solder group 5. The ideal solder inspection window is set to have a size slightly larger than the size of the ideal solder region Arh. The ideal solder inspection reference information Krh may be changed appropriately with a changed in the ideal solder region Arh.

The ideal adhesive inspection reference information generating unit 47 generates ideal adhesive inspection reference information Krs that indicates a reference inspection range of the adhesive 6, based on the design data or the manufacturing data stored in the storage device 42.

More specifically, the ideal adhesive inspection reference information generating unit 47 first obtains a planar region on the data occupied by the adhesive 6 as an ideal adhesive region Ars. The ideal adhesive inspection reference information generating unit 47 subsequently generates an ideal adhesive inspection window that has a similar shape to the shape of the ideal adhesive region Ars and that has center coordinates identical with the center coordinates of the ideal adhesive region Ars, as the ideal adhesive inspection reference information Krs. This ideal adhesive inspection window indicates an inspection reference range of the adhesive 6. The ideal adhesive inspection window is set to have a size slightly larger than the size of the ideal adhesive region Ars.

A solid region on the data occupied by the adhesive 6 on the substrate 1 or the like may be generated as the ideal adhesive region Ars. The ideal adhesive inspection reference information Krs may be changed appropriately with a change in the ideal adhesive region Ars.

The mounting position adjustment information generating unit 48 is configured to generate mounting position adjustment information Cji with regard to each solder group 5 or in other words with regard to each of the electronic components 4. The mounting position adjustment information Cji shows an amount of positional misalignment and a direction of positional misalignment of expected mounting position information relative to ideal mounting position information. The ideal mounting position information shows a mounting position on the design data or on the manufacturing data with regard to the electronic component 4 that is to be mounted on the solder group 5, and is identical with the ideal solder position information Prh according to one or more embodiments. The expected mounting position information shows an expected mounting position of the electronic component 4 that is to be mounted on the solder group 5, and is identical with the actual solder position information Pjh according to one or more embodiments.

According to one or more embodiments, the mounting position adjustment information Cji is generated, based on the amount of positional misalignment and the direction of positional misalignment of the actual solder position information Pjh relative to the ideal solder position information Prh. More specifically, vector information based on the actual solder position information Pjh [=(x, y)] and the ideal solder position information Prh [=(Lx, Ly)] is generated as the mounting position adjustment information Cji. An X component of the mounting position adjustment information Cji is "x−Lx" and a Y component of the mounting position adjustment information Cji is "y−Ly".

The electrode portion placement region generating unit 49 uses the mounting position adjustment information Cji to generate an electrode portion placement region Adh that indicates an expected placement region of each of the electrode portions 7 of the electronic component 4. According to one or more embodiments, the electrode portion placement region generating unit 49 generates a region obtained by shifting the expected placement region of the electrode portion 7 on the data by the mounting position adjustment information Cji, as the electrode portion placement region Adh.

The arithmetic device 43 inspects the good/poor qualities of the solder group 5 and the adhesive 6 on the substrate 1 and the successful/failed soldering, based on, for example, the information generated by the respective units 44 to 49 described above. The following describes an inspection process performed by the arithmetic device 43.

The arithmetic device 43 checks whether each of multiple pieces of the mounting position adjustment information Cji obtained by the mounting position adjustment information generating unit 48 is appropriate. More specifically, when the size of the mounting position adjustment information Cji, the magnitude of the X direction component of the mounting position adjustment information Cji or the magnitude of the Y direction component of the mounting position adjustment information Cji exceeds each predetermined reference value that is set in advance, the arithmetic device 43 determines that the solder 3 is printed at a significantly deviated position and has a poor printing quality. In this case, the arithmetic device 43 outputs the "printing failure signal" to the component mounting machine 22.

Furthermore, when each of the mounting position adjustment information Cji is appropriate, the arithmetic device 43 shifts the ideal solder inspection reference information Krh (ideal solder inspection window) by the mounting position adjustment information Cji to generate actual inspection reference information Kjh. The actual inspection reference information Kjh is generated for each solder group 5. According to one or more embodiments, the arithmetic device 43 generates an inspection window (actual solder inspection window) by shifting the ideal solder inspection window by the mounting position adjustment information Cji, as the actual inspection reference information Kjh. The actual solder inspection window has center coordinates that are identical with coordinates determined by shifting the center coordinates of the ideal solder inspection window by the mounting position adjustment information Cji and has a shape that is identical with the shape of the ideal solder inspection window.

The arithmetic device 43 subsequently uses the actual inspection reference information Kjh to inspect each solder group 5. More specifically, the arithmetic device 43 determines, with regard to each solder group 5, whether a ratio of a range occupied by a region other than the actual solder region Ajh to the actual inspection reference information Kjh (actual solder inspection window) exceeds a predetermined reference value that is set in advance. When this determination condition is unsatisfied with regard to all the respective solder groups 5, the arithmetic device 43 determines the printing quality of the solders 3 as "good printing quality".

When the above determination condition is satisfied with regard to at least one solder 3, on the other hand, the arithmetic device 43 determines the printing quality of the solders 3 as "poor printing quality" and outputs a "printing failure signal" to the component mounting machine 22.

Additionally, the arithmetic device 43 uses the ideal adhesive inspection reference information Krs (ideal adhesive inspection window) to inspect each adhesive 6. More specifically, the arithmetic device 43 determines, with regard to each adhesive 6, whether a ratio of a range occupied by a region other than the actual adhesive region Ajs to the ideal adhesive inspection reference information Krs (ideal adhesive inspection window) exceeds a predetermined reference value that is set in advance. When this determination condition is unsatisfied with regard to all the respective adhesives 6, the arithmetic device 43 determines the application quality of the adhesives 6 as "good application quality".

When the above determination condition is satisfied with regard to at least one adhesive 6, on the other hand, the arithmetic device 43 determines the application quality of the adhesives 6 as poor application quality and outputs an "application failure signal" to the component mounting machine 22. The operations of the component mounting machine 22 in response to the input of the "application failure signal" will be described later.

Additionally, the arithmetic device 43 calculates the area of a region of each adhesive 6 that overlaps with the solder 3. According to one or more embodiments, the arithmetic device 43 calculates the area of a region where the actual solder region Ajh overlaps with the actual adhesive region Ajs in a plan view of the substrate 1. When this calculated area exceeds a predetermined reference area that is set in advance, the arithmetic device 43 determines soldering as "failed soldering". The arithmetic device 43 then outputs a "failed soldering signal" to the component mounting machine 22. The operations of the component mounting machine 22 in response to the input of the "failed soldering signal" will be described later.

Furthermore, the arithmetic device 43 calculates the area of a region of each adhesive 6 that is expected to overlap with the electrode portion 7. According to one or more embodiments, the arithmetic device 43 calculates the area of a region where the electrode portion placement region Adh overlaps with the actual adhesive region Ajs. When this calculated area exceeds a predetermined reference area that is set in advance, the arithmetic device 43 determines soldering as "failed soldering" and outputs the "failed soldering signal" to the component mounting machine 22.

When the above determination result of soldering shows "not failed" with regard to all the adhesives 6, on the other hand, the arithmetic device 43 determines soldering as "successful soldering". The determination of the "successful/failed" soldering may be performed by using the area itself of an overlap region or by using a value based on the area of the overlap region, for example, a value obtained by dividing the area of the overlap region by the area of the solder 3, the area of the adhesive 6 or the area of the electrode portion 7 (the area of the actual solder region Ajh, the area of the actual adhesive region Ajs or the area of the electrode portion placement region Adh).

When the printing quality of the solders 3 and the application quality of the adhesives 6 are determined as "good qualities" and the soldering is determined as "successful soldering, the arithmetic device 43 determines that the substrate 1 is a "non-defective product". The arithmetic device 43 then outputs multiple pieces of the mounting position adjustment information Cji set with regard to each of the solder groups 5 to the component mounting machine 22.

The following describes the operations of the component mounting machine 22. When the mounting position adjustment information Cji is input after completion of the inspection process by the substrate inspection device 21, i.e., when the substrate 1 is determined as the "non-defective product", the component mounting machine 22 mounts the electronic component 4 on the substrate 1. More specifically, the component mounting machine 22 mounts an electronic component 4 on each solder group 5, such that the center of the electronic component 4 is located at a position shifted from a mounting position (ideal mounting position information) of the electronic component 4 on the design data or on the manufacturing data, which is input in advance, by the input mounting position adjustment information Cji. Accordingly, each electronic component 4 is mounted at an actual printing position of each solder group 5.

When the "printing failure signal", the "application failure signal" or the "failed soldering signal" is input from the arithmetic device 43, on the other hand, the component mounting machine 22 transfers the substrate 1 to a non-illustrated defective product hopper without mounting the electronic component 4 on the substrate 1.

Figure 6:
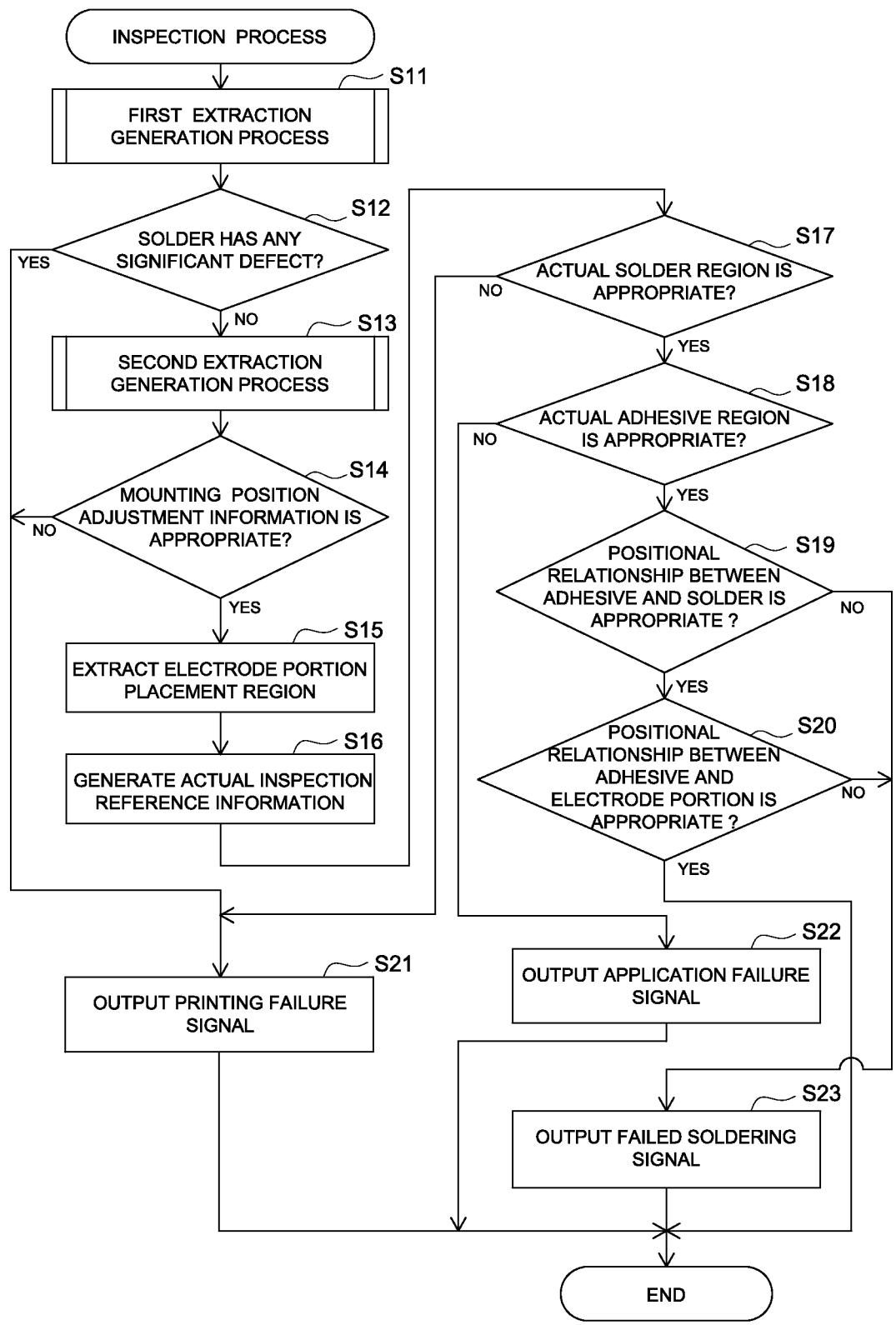
FIG. 6 is a flowchart showing an inspection process according to one or more embodiments.
Figure 8:
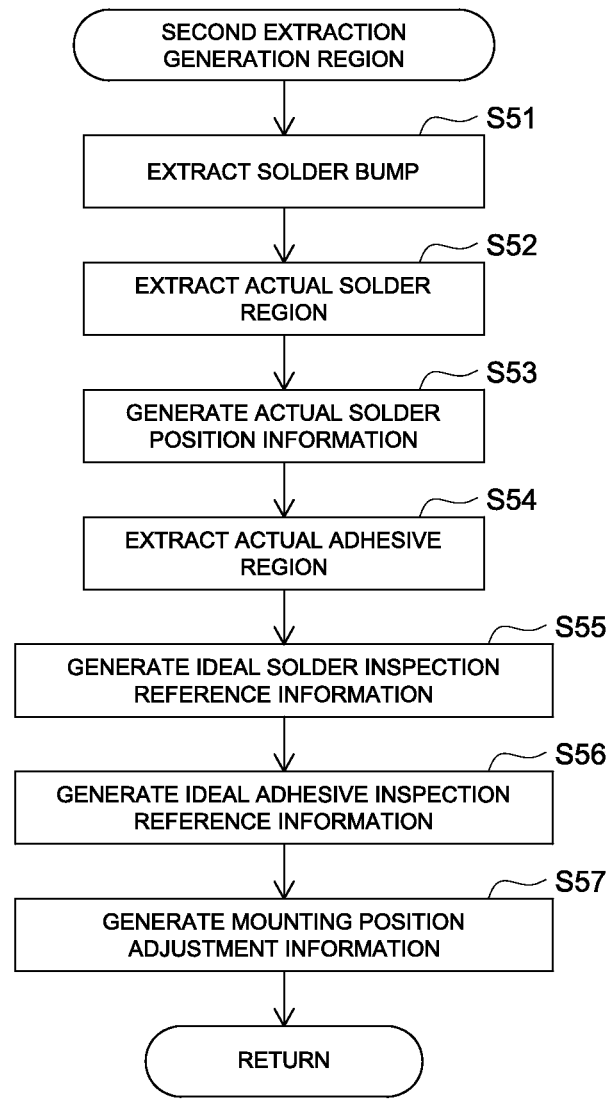
FIG. 8 is a flowchart showing a second extraction generation process according to one or more embodiments.

The following describes the inspection process performed by the substrate inspection device 21 more in detail with reference to the flowcharts of FIGS. 6 and 8 and other drawings. In FIGS. 9 to 20, an inspection standard, for example, the solder search region and the actual inspection reference information Kjh (actual solder inspection window), is shown by the thick line.

Figure 9:
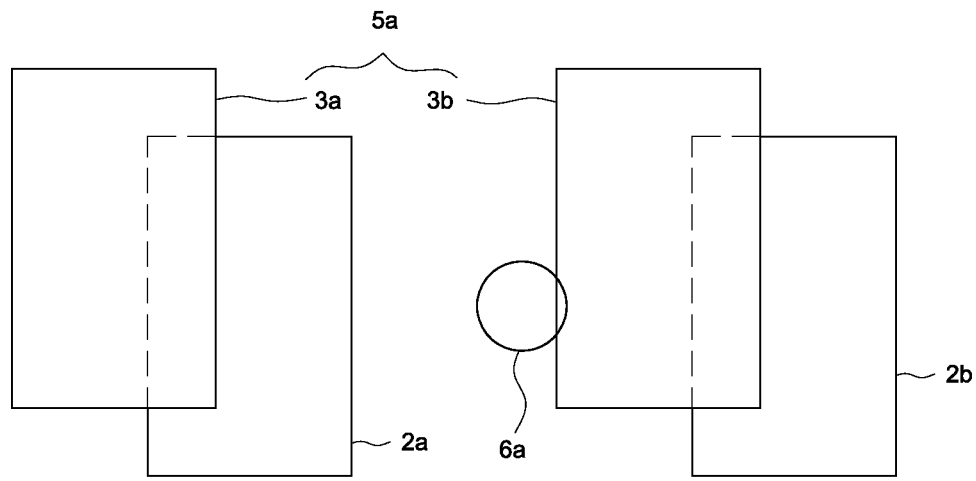
FIG. 9 is a schematic plan view illustrating the printing state of solders and the like used in the description of the inspection process according to one or more embodiments.

For the purpose of illustration, the inspection process described below is related to a solder group 5a comprised of solders 3a and 3b that are printed on electrode patterns 2a and 2b, and an adhesive 6a corresponding to the solder group 5a (respectively shown in FIG. 9). A similar inspection process is performed for the other solder groups 5 and for the other adhesives 6. It is assumed that the solders 3a and 3b have identical sizes and are printed to respectively have deviations of "2 mm" in an X-axis direction and "1 mm" in a Y-axis direction from the corresponding electrode patterns 2a and 2b. Furthermore, it is assumed that the solders 3a and 3b are printed to respectively have ideal sizes (dimensions). It is also assumed that the adhesive 6a is applied at an ideal position to have an ideal size. These numerical values are only illustrative.

The inspection process first performs a first extraction generation process at step S11 as shown in FIG. 6.

Figure 7:
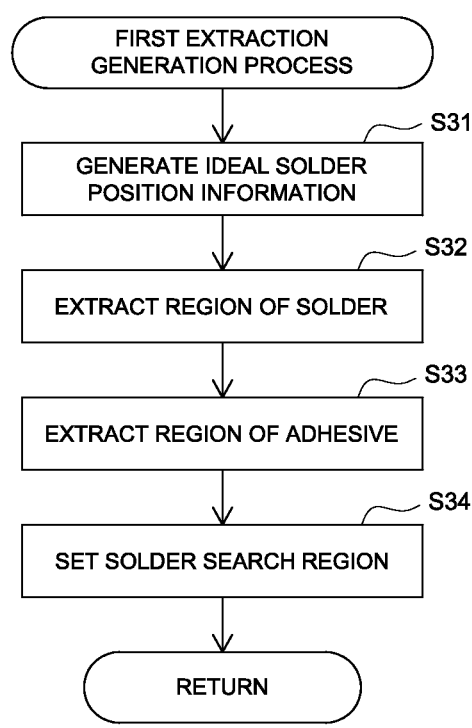
FIG. 7 is a flowchart showing a first extraction generation process according to one or more embodiments.
Figure 10:
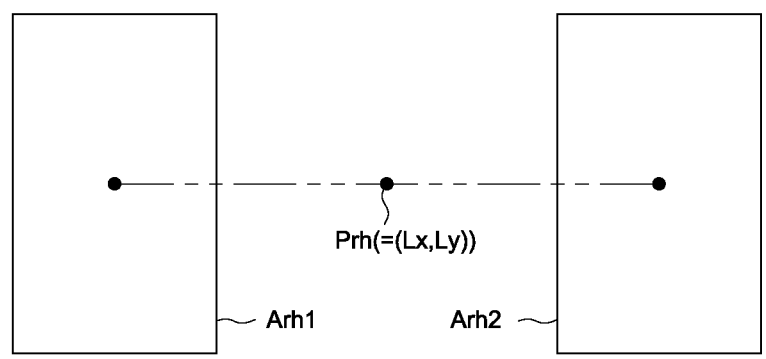
FIG. 10 is a schematic plan view illustrating ideal solder regions and ideal solder position information according to one or more embodiments.

The first extraction generation process generates ideal solder position information Prh, based on the design data or the like at step S31 as shown in FIG. 7. According to one or more embodiments, the first extraction generation process generates a midpoint (Lx, Ly) of center coordinates of an ideal solder region Arh1 with regard to the solder 3a on the design data or the manufacturing data and center coordinates of an ideal solder region Arh2 with regard to the solder 3b on the design data or the manufacturing data, as the ideal solder position information Prh (as shown in FIG. 10).

At step S32 and step S33, the first extraction generation process subsequently extracts respective planar regions occupied by the solder 3 and the adhesive 6 on the substrate 1, based on the image data taken by the CCD camera 33. Information regarding the extracted planar regions is stored in the storage device 42.

Figure 11:
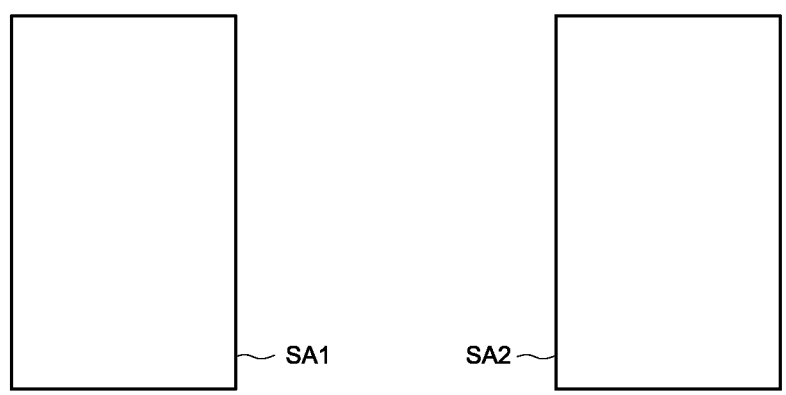
FIG. 11 is a schematic plan view illustrating solder search regions according to one or more embodiments.

At step S34, the first extraction generation process then sets solder search regions SA1 and SA2 that respectively have center coordinates identical with the center coordinates of the ideal solder regions Arh1 and Arh2 and that are slightly larger than the ideal solder regions Arh1 and Arh2 (as shown in FIG. 11).

Referring back to FIG. 6, the inspection process determines whether the printing quality of the solder 3 has any significant defect at step S12 subsequent to the first extraction generation process. More specifically, the inspection process determines whether a planar region of each of the solders 3 that is present in the solder search region SA1 or SA2 occupies a predetermined or greater ratio of the area of the solder search region SA1 or SA2. The inspection process also determines whether there are a plurality of planar regions of the solder 3 respectively having predetermined or larger areas (for example, 20% of the area of the solder search region SA1 or SA2) in the solder search region.

When the planar region of each of the solders 3a and 3b occupies the predetermined or greater ratio of the area of the solder search region SA1 or SA2 and a plurality of planar regions of the solder 3a or 3b respectively having the predetermined or larger areas are not present in the solder search region SA1 or SA2, i.e., in the case of a negative answer at step S12, the inspection process proceeds to a second extraction generation process of step S13.

When the ratio of the planar region of each of the solders 3a and 3b to the area of the solder search region SA1 or SA2 is less than the predetermined ratio or when a plurality of planar regions of the solder 3 respectively having the predetermined or larger areas are present in the solder search region SA1 or SA2, i.e., in the case of an affirmative answer at step S12, on the other hand, the inspection process proceeds to step S21. The inspection process outputs the "printing failure signal" to the component mounting machine 22 at step S21 and is then terminated.

Figure 12:
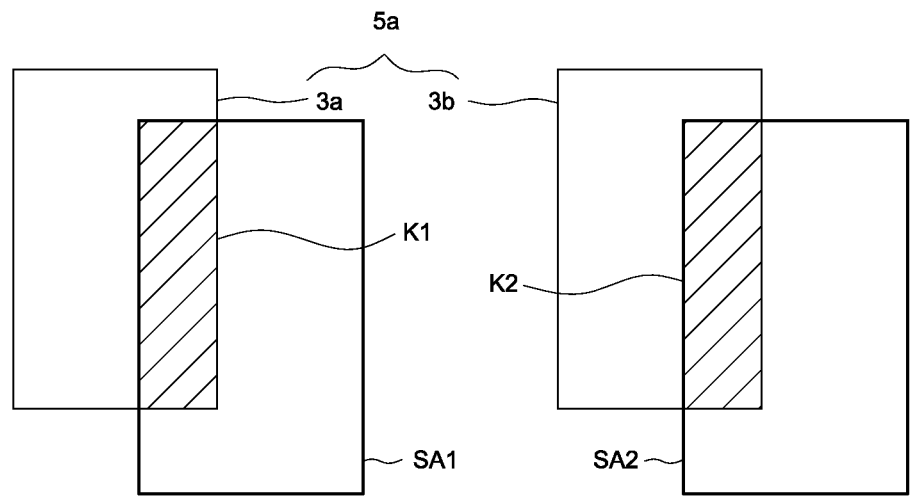
FIG. 12 is a schematic plan view illustrating solder bumps and the like according to one or more embodiments.

The following describes the second extraction generation process of step S13. As shown in FIG. 8, at step S51, the second extraction generation process first extracts the solders 3a and 3b that are respectively present in the solder search regions SA1 and SA2, as solder bumps K1 and K2 (areas shown by slant lines in FIG. 12) (as shown in FIG. 12).

Figure 13:
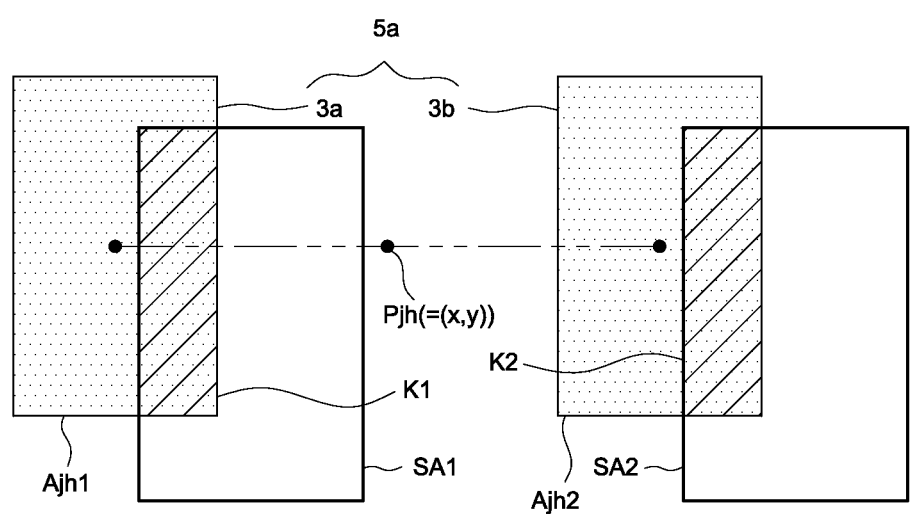
FIG. 13 is a schematic plan view illustrating actual solder regions, actual solder position information and the like according to one or more embodiments.

At step S52 subsequent to step S51, the second extraction generation process extracts actual solder regions Ajh. More specifically, the second extraction generation process extracts solder regions inked with the extracted solder bumps K1 and K2, as actual solder regions Ajh1 and Ajh2 (areas shown by the dotted pattern in FIG. 13) (as shown in FIG. 13).

At step S53, the second extraction generation process subsequently generates actual solder position information Pjh. According to one or more embodiments, the second extraction generation process generates a midpoint (x, y) of the center of gravity coordinates of the actual solder region Ajh1 and the center of gravity coordinates of the actual solder region Ajh2, as the actual solder position information Pjh (as shown in FIG. 13).

Figure 14:
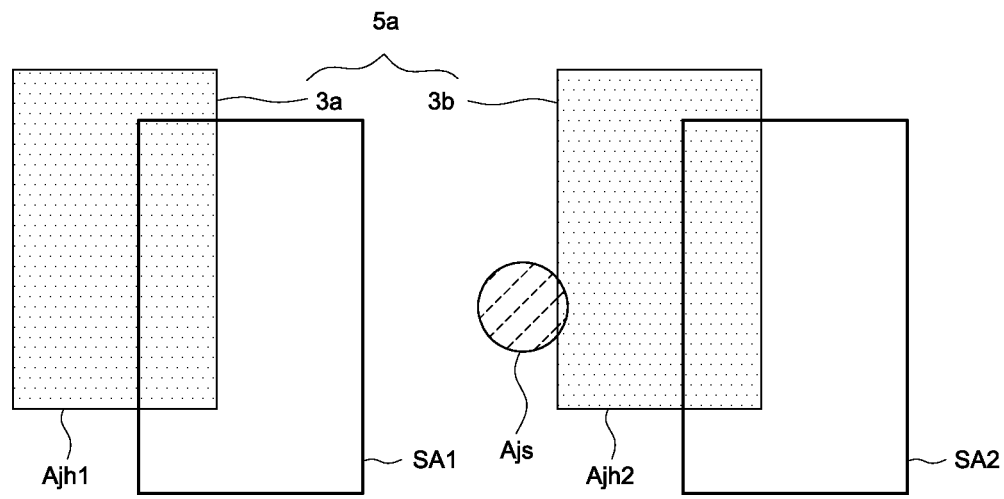
FIG. 14 is a schematic plan view illustrating an actual adhesive region and the like according to one or more embodiments.

Additionally, at step S54, the second extraction generation process extracts an actual adhesive region Ajs. According to one or more embodiments, the planar region occupied by the adhesive 6 and extracted at step S33 is extracted as the actual adhesive region Ajs (area shown by slant broken line in FIG. 14) (as shown in FIG. 14).

Figure 15:
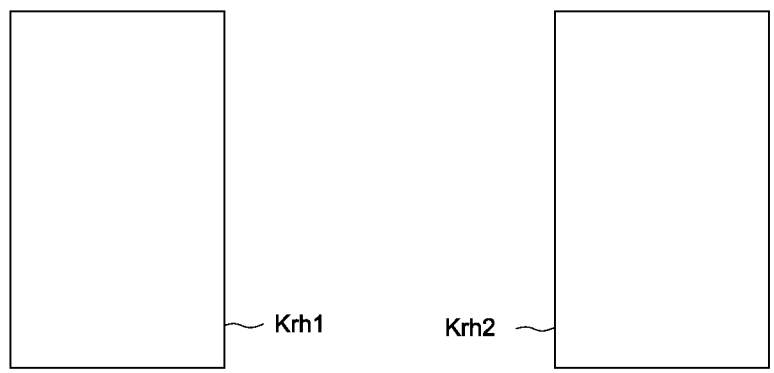
FIG. 15 is a schematic plan view illustrating ideal solder inspection reference information according to one or more embodiments.

At subsequent step S55, the second extraction generation process generates ideal solder inspection reference information Krh (ideal solder inspection windows). According to one or more embodiments, the second extraction generation process generates ideal solder inspection windows that respectively have shapes similar to the shapes of the ideal solder regions Arh1 and Arh2, that are slightly larger than the ideal solder regions Arh1 and Arh2, and that respectively have center coordinates, which are identical with the respective center of gravity coordinates of the ideal solder regions Arh1 and Arh2, as ideal solder inspection reference information Krh1 and Krh2 (as shown in FIG. 15).

Figure 16:
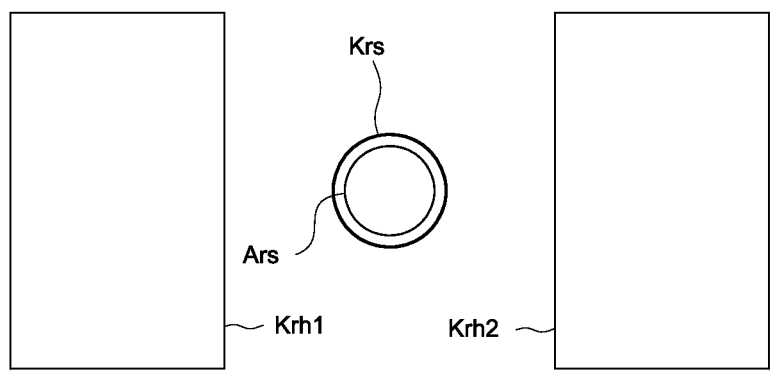
FIG. 16 is a schematic plan view illustrating ideal adhesive inspection reference information according to one or more embodiments.

Additionally, at step S56, the second extraction generation process generates ideal adhesive inspection reference information Krs. More specifically, the second extraction generation process extracts a planar region occupied by the adhesive 6a on the data as an ideal adhesive region Ars and subsequently generates an ideal adhesive inspection window that has a shape similar to the shape of the ideal adhesive region Ars, that is slightly larger than the ideal adhesive region Ars and that has center coordinates, which are identical with the center of gravity coordinates of the ideal adhesive region Ars, as the ideal adhesive inspection reference information Krs (as shown in FIG. 16).

Figure 17:
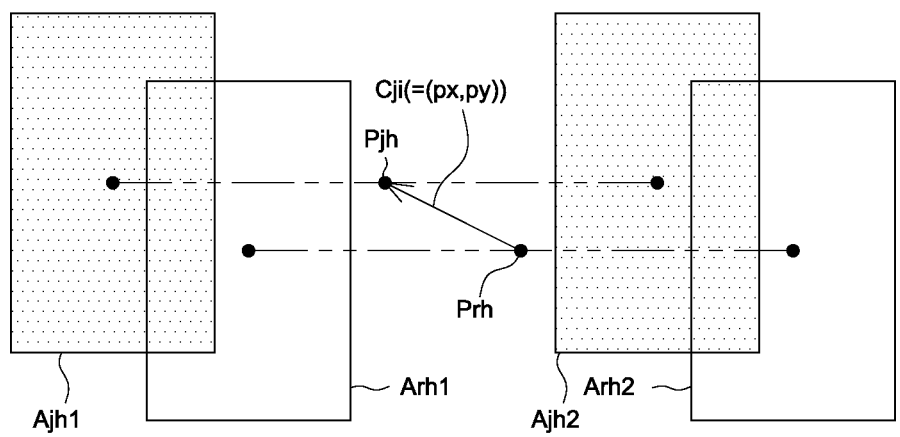
FIG. 17 is a schematic plan view illustrating mounting position adjustment information and the like according to one or more embodiments.

At step S57, the second extraction generation process subsequently generates mounting position adjustment information Cji. More specifically, the second extraction generation process generates vector information [=(Px, Py)] based on the actual solder position information Pjh [=(x, y)] generated at step S53 and the ideal solder position information Prh [=(Lx, Ly)] generated at step S31, as the mounting position adjustment information Cji (as shown in FIG. 17).

Referring back to FIG. 6, the inspection process determines whether the generated mounting position adjustment information Cji is appropriate at step S14 subsequent to the second extraction generation process. For example, the inspection process checks the size or the like of the mounting position adjustment information Cji. When the mounting position adjustment information Cji is inappropriate (step S14: NO), the inspection process outputs the "printing failure signal" at step S21 and is then terminated.

Figure 18:
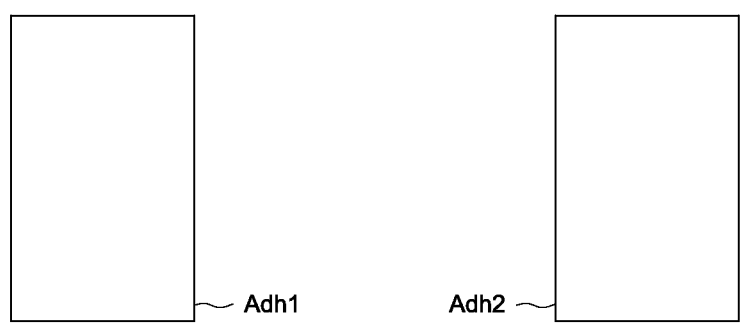
FIG. 18 is a schematic plan view illustrating electrode portion placement regions according to one or more embodiments.

When the mounting position adjustment information Cji is appropriate (step S14: YES), on the other hand, the inspection process proceeds to step S15 to extract electrode portion placement regions Adh1 and Adh2, based on the design data or the like (as shown in FIG. 18).

Figure 19:
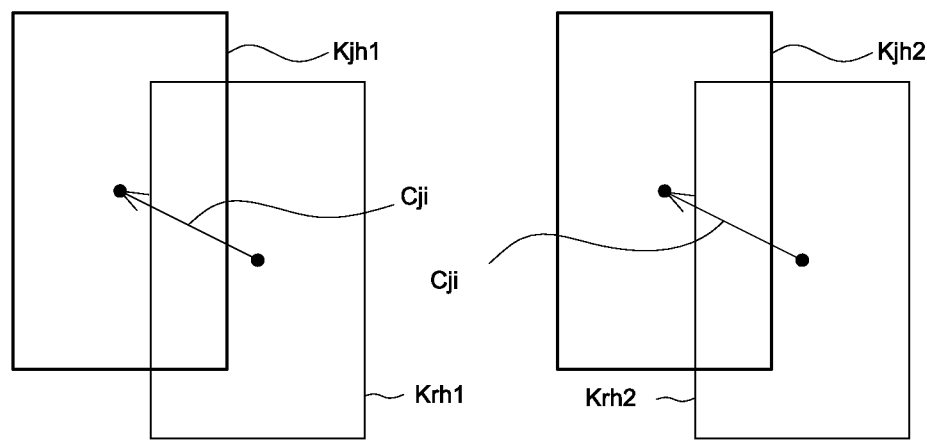
FIG. 19 is a schematic plan view illustrating actual inspection reference information according to one or more embodiments.

At step S16, the inspection process subsequently generates actual inspection reference information Kjh. According to one or more embodiments, the inspection process generates actual solder inspection windows obtained by shifting the respective pieces of ideal solder inspection reference information (ideal solder inspection windows) Krh1 and Krh2 by the mounting position adjustment information Cji, as actual inspection reference information Kjh1 and Kjh2 (as shown in FIG. 19).

Figure 20:
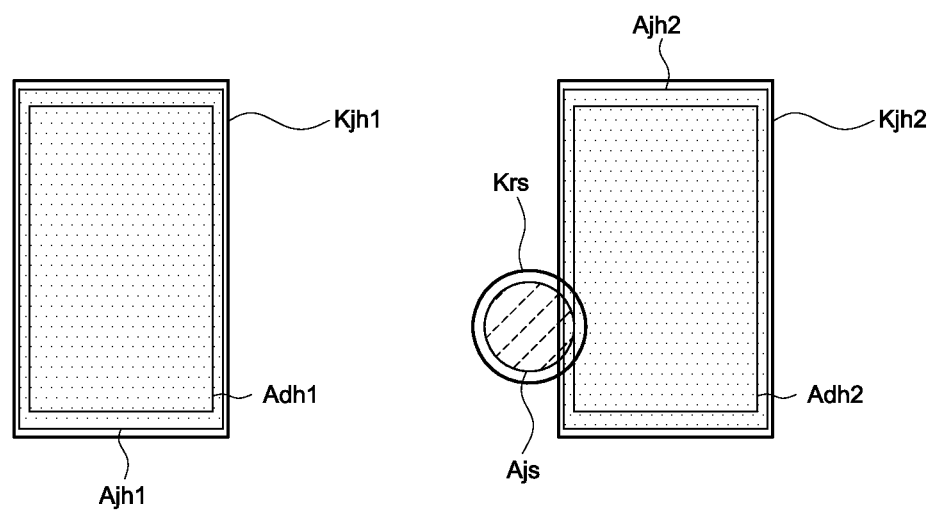
FIG. 20 is a schematic plan view illustrating inspection of solders and an adhesive using the actual inspection reference information and the ideal adhesive inspection reference information according to one or more embodiments.

At step S17, the inspection process subsequently uses the actual inspection reference information Kjh1 and Kjh2 (ideal solder inspection windows) to determine whether the actual solder regions Ajh1 and Ajh2 are appropriate. More specifically, the inspection process determines whether the ratio of a range occupied by a region other than the actual solder region Ajh1 or Ajh2 to a corresponding piece of the actual inspection reference information Kjh1 or Kjh2 (actual solder inspection window) exceeds a reference value that is set in advance (as shown in FIG. 20). When the ratio of the range occupied by the region other than the actual solder region Ajh1 to the actual inspection reference information Kjh1 is equal to or less than the above reference value and the ratio of the range occupied by the region other than the actual solder region Ajh2 to the actual inspection reference information Kjh2 is equal to or less than the above reference value (step S17: YES), the inspection process determines the printing quality of the solder group 5a as "good printing quality" and proceeds to step S18.

When the ratio of the range occupied by the region other than the actual solder region Ajh1 to the actual inspection reference information Kjh1 is greater than the above reference value or when the ratio of the range occupied by the region other than the actual solder region Ajh2 to the actual inspection reference information Kjh2 is greater than the above reference value (step S17: NO), on the other hand, the inspection process determines the printing quality of the solder group 5 as "poor printing quality". The inspection process accordingly outputs the "printing failure signal" to the component mounting machine 22 at step S21 and is then terminated.

When the actual solder regions Ajh1 and Ajh2 are appropriate (step S17: YES), the inspection process uses the ideal adhesive inspection reference information Krs (ideal adhesive inspection window) to determine whether the actual adhesive region Ajs is appropriate at step S18. More specifically, the inspection process determines whether the ratio of a range occupied by a region other than the actual adhesive region Ajs to the ideal adhesive inspection reference information Krs exceeds a reference value that is set in advance (as shown in FIG. 20). When this condition of the determination is not satisfied and the actual adhesive region Ajs is appropriate (step S18: YES), the inspection process determines the application quality of the adhesive 6a as "good application quality" and proceeds to step S19.

When the above condition of the determination is satisfied and the application state of the adhesive 6a is inappropriate (step S18: NO), on the other hand, the inspection process proceeds to step S22. The inspection process outputs the "application failure signal" to the component mounting machine 22 at step S22 and is then terminated.

Figure 21:
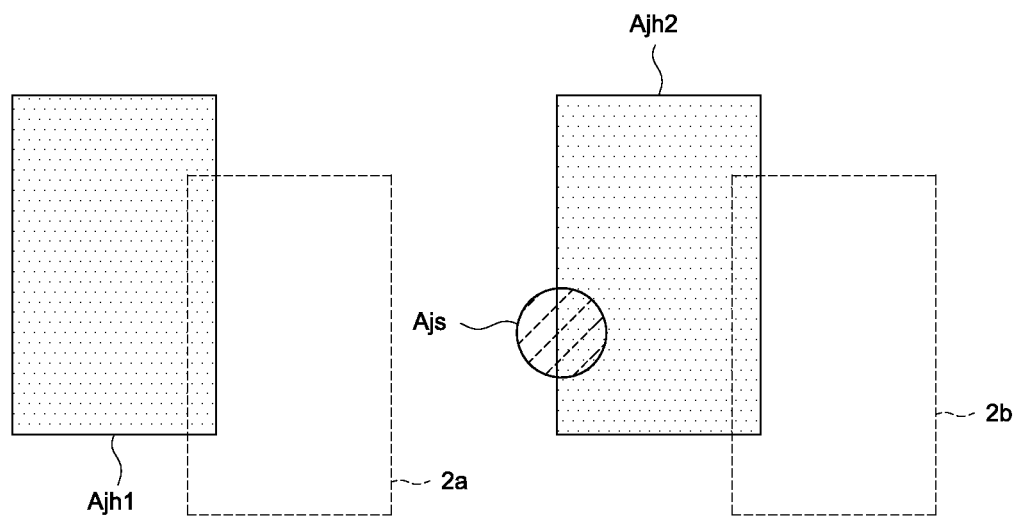
FIG. 21 is a schematic plan view illustrating the actual adhesive region and the like when a positional relationship between an adhesive and solders is inappropriate according to one or more embodiments.
Figure 22:
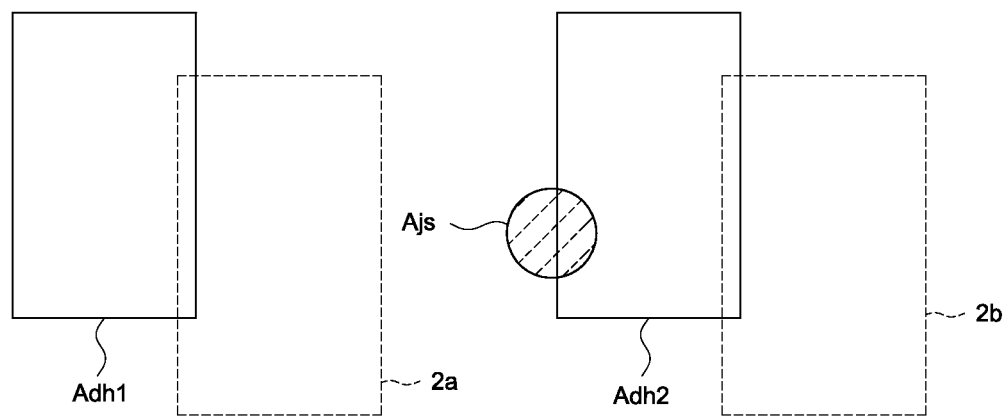
FIG. 22 is a schematic plan view illustrating the actual adhesive region and the like when a positional relationship between an adhesive and expected placement regions of electrode portions is inappropriate according to one or more embodiments.

At step S19, the inspection process determines whether a positional relationship between the adhesive 6a and the solders 3a and 3b is appropriate. More specifically, the inspection process calculates the area of an overlap region between the actual solder regions Ajh1 and Ajh2 and the actual adhesive region Ajs and determines whether this area of the overlap region exceeds a predetermined reference area that is set in advance. When the area of the overlap region exceeds the above reference area and the positional relationship between the adhesive 6a and the solders 3a and 3b is inappropriate (for example, in the state shown in FIG. 21), the inspection process determines soldering as failed soldering. The inspection process accordingly outputs the "failed soldering signal" to the component mounting machine 22 at step S23 and is then terminated. Outer edges of the electrode patterns 2a and 2b are shown by broken lines in FIG. 21 and FIG. 22, with a view to indicating the positions of the actual solder regions Ajh1 and Ajh2 and the actual adhesive region Ajs on the substrate 1.

When the area of the overlap region is equal to or less than the above reference area and the positional relationship between the adhesive 6a and the solders 3a and 3b is appropriate (step S19: YES), on the other hand, the inspection process proceeds to step S20.

At step S20, the inspection process determines whether a positional relationship between the adhesive 6a and the electrode portion placement regions Adh1 and Adh2 is appropriate. More specifically, the inspection process calculates the area of an overlap region between the actual adhesive region Ajs and the electrode portion placement region Adh1 and Adh2 and determines whether this area of the overlap region exceeds a predetermined reference area that is set in advance. When the area of the overlap region exceeds the above reference area and the positional relationship between the adhesive 6a and the electrode portion placement regions Adh1 and Adh2 is inappropriate (for example, in the state shown in FIG. 22), the inspection process determines soldering as failed soldering. The inspection process accordingly outputs the "failed soldering signal" to the component mounting machine 22 at step S23 and is then terminated.

When the area of the overlap region is equal to or less than the above reference area and the positional relationship between the adhesive 6a and the electrode portion placement regions Adh1 and Adh2 is appropriate (step S20:YES), on the other hand, the inspection process determines soldering as successful soldering and is then terminated.

The series of the inspection process described above is subsequently performed for the solder groups 5 other than the solder group, for the adhesives 6 other than the adhesive 6a and the like. When the determination result of "good quality or "successful" is provided for all the solder groups 5, the adhesives 6 and the like, the substrate 1 is determined as a "non-defective product". Multiple pieces of the mounting position adjustment information Cji set for each solder group 5 are output to the component mounting machine 22.

When the determination result of "poor quality" or "failed" is provided for any of the respective solder groups 5, the respective adhesives 6 and the like, on the other hand, the substrate 1 is determined as a "defective product". In this case, no mounting position adjustment information Cji is output to the component mounting machine 22, and no electronic component 4 is mounted on the substrate 1.

Figure 23:
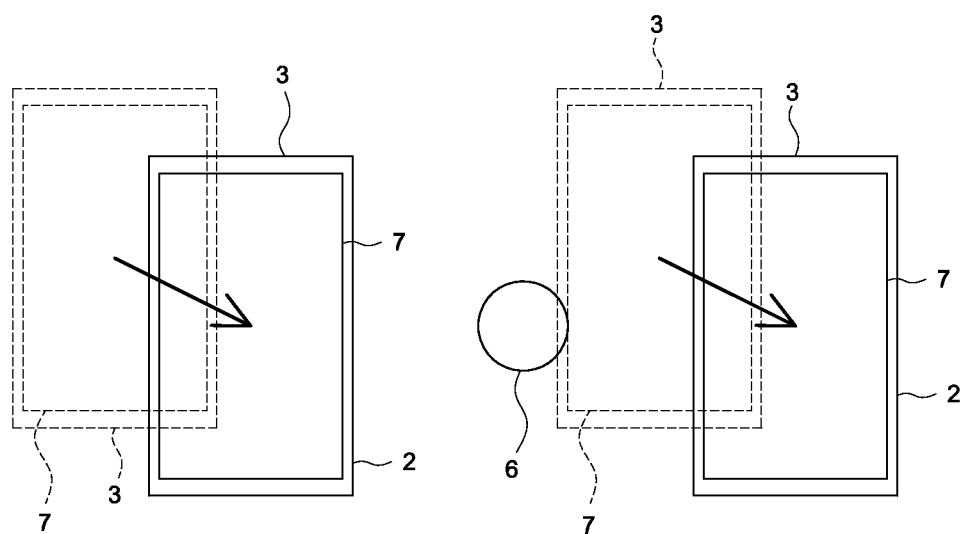
FIG. 23 is a schematic plan view illustrating placement of solders and the like at appropriate positions by self-alignment effect according to one or more embodiments.

The substrate 1 with the electronic components 4 mounted thereon by the component mounting machine 22 is led to the reflow device 15 as described above. The self-alignment effect is exerted in a reflow process. As shown in FIG. 23, this causes the solder 3 to be placed on the electrode pattern 2 and thereby causes the electrode portion 7 to be placed at an appropriate position. As a result, the electronic component 4 is placed at an appropriate position (not shown in FIG. 23 or FIG. 24).

Figure 24:
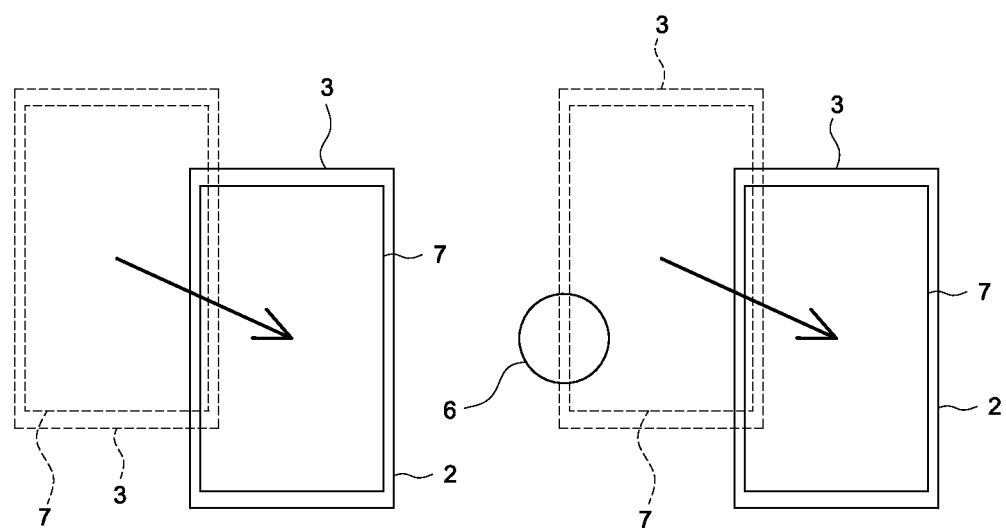
FIG. 24 is a schematic plan view illustrating the probability of placement of solders and the like at appropriate positions by the self-alignment effect even in the event of failed soldering according to one or more embodiments.

When the electronic component 4 is mounted on the substrate 1 that has the determination result of "failed soldering" and this substrate 1 with the electronic component 4 is led to the reflow process, exertion of the self-alignment effect causes the solder 3 to be placed on the electrode pattern 2 and thereby causes the electrode portion 7 and the electronic component 4 to be placed at appropriate positions as shown in FIG. 24. The solder 3, the electronic component 4 and the like apparently seem to be placed at appropriate positions. In the actual state, however, a large amount of the adhesive 6 is likely to adhere to the solder 3 or the electrode portion 7 and cause poor electrical continuity. Accordingly, when the substrate 1 has the determination result of "failed soldering", no electronic component 4 is mounted on this substrate 1 as described above.

As described above in detail, according to one or more embodiments, the curing temperature of the adhesive 6 is set to be higher than the melting temperature of the solder 3. This accordingly allows for exertion of the self-alignment effect.

Information based on the amount of positional misalignment and the direction of positional misalignment of the actual solder position information Pjh relative to the ideal solder position information Prh is output to the component mounting machine 22, as the mounting position adjustment information Cji. This configuration enables the electronic component 4 to be placed at a position determined by taking into account the self-alignment effect and more reliably mounts the electronic component 4 at an appropriate position. This configuration utilizes the information that is generated in the inspection process, for the mounting process of the electronic component 4. There is accordingly no need to perform a series of processing, which is similar to that performed in the inspection process, in a duplicated manner in the mounting process. This improves the manufacturing efficiency.

According to one or more embodiments, even under the condition of exertion of the self-alignment effect, inspection of the adhesive 6 is performed based on the ideal adhesive inspection reference information Krs. By taking into account the fact that the adhesive 6 is not moved even under the condition of exertion of the self-alignment effect, inspection of the application quality of the adhesive 6 is performed, based on the position and the region of the adhesive 6 on the design data or on the manufacturing data (an ideal position and an ideal region of the adhesive 6 on an eventually produced substrate 1). This configuration accordingly enables the application quality of the adhesive 6 to be appropriately inspected. As a result, this configuration prevents the electronic components 4 from being mounted on the substrate 1 where the adhesive 6 is not appropriately applied, thus enhancing the yield and suppressing an increase in the manufacturing cost.

While inspection of the adhesive 6 is performed based on the ideal adhesive inspection reference information Krs as described above, inspection of each of the solders 3 included in the solder group 5 is performed based on an inspection reference position (actual inspection reference information Kjh) obtained by shifting an inspection reference position of the solder 3 in an ideal printing state (ideal solder inspection reference information Krh) by the mounting position adjustment information Cji. Accordingly, by taking into account the condition that the self-alignment effect is likely to exerted, the reference position of inspection is changed in the unit of an electronic component 4 (in the unit of a solder group 5), based on the position of the actually printed solder 3, and inspection of each solder 3 is performed based on this changed reference position. This configuration enables the printing quality of the solder 3 to be appropriately inspected by taking into account the self-alignment effect. In combination with the appropriate inspection of the application quality of the adhesive 6, this configuration more effectively enhances the yield and suppresses an increase in the manufacturing cost.

Furthermore, the successful/failed soldering is determined, based on the overlap area between the adhesive 6 and the solder 3 and the overlap area between the adhesive 6 and the expected placement region of the electrode portion 7. Accordingly, this configuration enables the actual failed soldering to be appropriately grasped after the reflow process, even when the solder 3, the electronic component 4 and the like apparently seem to be placed at appropriate positions. This configuration enhances the inspection accuracy.

The present invention is not limited to the above embodiments but may be implemented, for example, by configurations described below. The present invention may also be naturally implemented by applications and modifications other than those illustrated below.

(a) According to the embodiments described above, one piece of coordinate information is generated with respect to each of the solder groups 5, as the ideal solder position information Prh and as the actual solder position information Pjh. According to a modification, coordinate information may be generated with respect to each of the solders 3 included in each solder group 5, as the ideal solder position information Prh and as the actual solder position information Pjh. For example, center of gravity coordinates of each of the solders 3 on the data may be generated as the ideal solder position information Prh, and center of gravity coordinates of each of the solders 3 actually printed may be generated as the actual solder position information Pjh. The type of the ideal solder position information needs to be identical with the type of the actual solder position information.

When multiple pieces of coordinate information are generated as the ideal solder position information Prh and as the actual solder position information Pjh like the above modification, the ideal solder inspection reference information Krh, the mounting position adjustment information Cji and the actual inspection reference information Kjh may also be modified appropriately. For example, coordinates identical with the center of gravity coordinates of the ideal solder region Arh may be generated as the ideal solder inspection reference information Krh. For example, vector information [=(Qx, Qy)] may be generated with regard to each of the solder groups 5, as the mounting position adjustment information Cji. This vector information may be comprised of, for example, an average value (Qx) of an amount of positional misalignment Ax along the X-axis direction and an average value (Qy) of an amount of positional misalignment Ay along the Y-axis direction of the actual solder position information Pjh relative to the ideal solder position information Prh. Additionally, coordinates obtained by shifting the ideal solder inspection reference information Krh (coordinate information) by the vector information may be generated as the actual inspection reference information Kjh.

A modified procedure of inspection of the printing quality of the solder 3 may inspect the good/poor printing quality of the solder group 5 by determining whether respective absolute values of amounts of positional misalignment along the X-axis direction and along the Y-axis direction of the actual solder position information Pjh relative to the actual inspection reference information Kjh are within predetermined reference values that are set in advance. More specifically, when the respective amounts of positional misalignment are equal to or less than the respective reference values with regard to the respective solders 3 included in the solder group 5, the printing quality of the solder group 5 may be determined as "good printing quality". When at least one of the respective amounts of positional misalignment is greater than the corresponding reference value with regard to at least one of the solders 3 included in the solder group 5, the printing quality of the solder group 5 may be determined as "poor printing quality".

Additionally, a modified procedure may generate center of gravity coordinates of the adhesive 6 on the data as the ideal adhesive inspection reference information Krs and may generate center of gravity coordinates of the actually applied adhesive 6 as the actual adhesive region Ajs. The modified procedure may then determine the good/poor application quality of the adhesive 6, based on the amount of positional misalignment between the ideal adhesive inspection reference information Krs and the actual adhesive region Ajs.

(b) According to the embodiments described above, the inspection process is performed for all the solder groups 5 and for all the adhesives 6. According to a modification, the inspection process may be performed only for a predetermined solder group 5 or only for a predetermined adhesive 6 selected by an operator or the like. This simplifies the inspection process and improves the manufacturing efficiency. In this modification, an average of the mounting position adjustment information Cji with regard to a solder group 5 as an inspection object may be used as the mounting position adjustment information Cji with regard to solder groups 5 other than the solder group 5 as the inspection object.

(c) According to the embodiments described above, the vector information is generated as the mounting position adjustment information Cji, and the electronic component 4 is mounted at the position determined by shifting the ideal mounting position information by this vector information. In other words, the electronic component 4 is mounted at the position determined by shifting the ideal mounting position information in the X-axis direction and in the Y-axis direction. According to a modification, rotation angle information may be generated as the mounting position adjustment information Cji. For example, a range of coordinates indicating the ideal solder region Arh may be set to the ideal solder position information Prh, and a range of coordinates indicating the actual solder region Ajh may be set to the actual solder position information Pjh. An amount of rotation and a direction of rotation of the actual solder position information Pjh about the center of the electronic component 4 on the data as a rotational center relative to the ideal solder position information Prh may be generated as the mounting position adjustment information Cji. The mounting position of the electronic component 4 may be adjusted, based on the amount of rotation and the direction of rotation. According to another modification, the mounting position adjustment information Cji may include both the vector information and the information regarding the amount of rotation and the direction of rotation.

(d) The above embodiments determine the good/poor printing quality of each solder group 5 by determining whether the ratio of the range occupied by the region other than the actual solder region Ajh to the actual inspection reference information Kjh (actual solder inspection window) exceeds the predetermined reference value. A modification may determine the good/poor printing quality of each solder group 5 by determining whether an amount of positional misalignment of the center of gravity coordinates of the actual solder region Ajh relative to the center coordinates of the actual inspection reference information Kjh (actual solder inspection window) exceeds a predetermined reference value. Another modification may determine the good/poor printing quality of each solder group 5, based on a matching ratio of the actual solder region Ajh relative to the actual inspection reference information Kjh (actual solder inspection window).

Additionally, this good/poor quality determination procedure may be applied to inspection of the adhesive 6. More specifically, a modified procedure may determine the good/poor application quality of the adhesive 6 by determining whether an amount of positional misalignment of the center of gravity coordinates of the actual adhesive region Ajs relative to the center coordinates of the ideal adhesive inspection reference information Krs (ideal adhesive inspection window) exceeds a predetermined reference value. Another modified procedure may determine the good/poor application quality of the adhesive 6, based on a matching ratio of the actual adhesive region Ajs relative to the ideal adhesive inspection reference information Krs (ideal adhesive inspection window).

(e) At the time when the "printing failure signal", the "application failure signal" or the "failed soldering signal" is output, the inspection process performed by the substrate inspection device 21 may be skipped with regard to uninspected solder groups 5 or uninspected adhesives 6 and may be terminated, although this is not specifically described in the above embodiments. This modification suppresses continuation of the inspection process with respect to the substrate 1 that is a defective product and thereby improves the inspection efficiency.

(f) According to the embodiments described above, the ideal solder inspection reference information Krh and the actual inspection reference information Kjh are set to be larger than the ideal solder region Arh. According to a modification, the ideal solder inspection reference information Krh and the actual inspection reference information Kjh may be set to have identical sizes with the size of the ideal solder region Arh. The ideal adhesive inspection reference information Krs may be set to have an identical size with the size of the ideal adhesive region Ars.

(g) The above embodiments generate the ideal solder region Arh and subsequently generate the ideal solder position information Prh from the ideal solder region Arh. A modification may generate the ideal solder position information Prh directly from the design data or from the manufacturing data without generating the ideal solder region Arh.

(h) The above embodiments generate the ideal solder inspection reference information Krh, based on the ideal solder region Arh. A modification may store in advance information with regard to an inspection reference position and an inspection reference range in the form of design data or in the form of manufacturing data in the storage device 42 and may generate the ideal solder inspection reference information Krh, based on the stored information.

(i) When the "printing failure signal" is output in the process of inspection of a plurality of solder groups 5, there is a possibility that a metal screen is placed at a position deviated from the substrate 1, although this is not specifically described in the above embodiments. With a view to correcting such a positional misalignment of the metal screen, a modification may adjust the solder printing position by the solder printing machine 11 (i.e., may move the metal screen), based on the mounting position adjustment information generated with regard to respective solder groups 5.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 . . . substrate, 3 . . . solder paste (solder), 4 . . . electronic component, 5 . . . solder group, 6 . . . adhesive, 7 . . . electrode portion, 12 . . . solder printing device (solder printing machine), 21 . . . substrate inspection device, 22 . . . component mounting machine, 32 . . . illumination device (irradiation unit or irradiator), 33 . . . CCD camera (imaging unit or imaging device), 45 . . . image processing unit (actual solder position information generating unit), 46 . . . ideal solder inspection reference information generating unit, 47 . . . ideal adhesive inspection reference information generating unit, Ajh . . . actual solder region, Ajs . . . actual adhesive region, Arh . . . ideal solder region, Ars . . . ideal adhesive region, Cji . . . mounting position adjustment information, Kjh . . . actual inspection reference information, Krh . . . ideal solder inspection reference information, Krs . . . ideal adhesive inspection reference information, Pjh . . . actual solder position information, Prh . . . ideal solder position information

The invention claimed is:

1. A substrate inspection device that is placed on an upstream side of a component mounting machine that mounts an electronic component on solder that is printed on a substrate by a solder printing machine, and that inspects the solder and a thermosetting adhesive applied on the substrate, the substrate inspection device comprising:

a mounting table that comprises a motor and that can move the substrate placed on the mounting table in a horizontal direction;

an illumination device that irradiates the solder and the adhesive on the substrate with light;

an imaging device that takes an image of the irradiated solder and the irradiated adhesive and outputs the image; and a control device that is electrically connected to and controls the motor, the illumination device, and the imaging device, and that is configured to:

generate: actual solder position information of a solder group that includes two or more solders and on which the electronic component is mounted based on the image, received from the imaging device, that was taken while the mounting table is moving the substrate; ideal solder inspection reference information indicating a reference inspection position and/or a reference inspection range of each of the solders; and ideal adhesive inspection reference information indicating a reference inspection position and/or a reference inspection range of the adhesive, wherein the ideal solder inspection reference information and the ideal adhesive inspection reference information are based on design data or manufacturing data stored in a storage, and the adhesive has a curing temperature higher than a melting temperature of the solders, inspect each of the solders based on actual inspection reference information obtained by shifting the ideal solder inspection reference information by mounting position adjustment information, while inspecting the adhesive based on the ideal adhesive inspection reference information, and upon determining that a printing state of the solders and an application state of the adhesive do not meet a predetermined condition, output, to the component mounting machine, the actual inspection reference information and upon determining that at least one of the printing state and the application state meet the predetermined condition, output, to the component mounting machine, at least one of a printing failure signal, an application failure signal, and failed soldering signal, wherein the mounting position adjustment information indicates an amount and direction of positional misalignment of an expected mounting position information, and the expected mounting position information indicates an expected mounting position of the electronic component relative to an ideal mounting position information that indicates an ideal mounting position of the electronic component mounted on the solder group.

2. The substrate inspection device according to claim 1, wherein the adhesive is an insulating adhesive, and prior to a predetermined reflow process, the control device:

calculates an area of an overlap region between each of the solders and the adhesive, and determines successful or failed soldering based on the calculated area.

3. The substrate inspection device according to claim 2, wherein
the adhesive is an insulating adhesive, and
prior to a predetermined reflow process, the control device:
calculates an area of an overlap region between:
an expected placement region of an electrode portion of the electronic component that is mounted on the solders, and
the adhesive, and
determines successful or failed soldering based on the calculated area.

4. The substrate inspection device according to claim 1, wherein
the adhesive is an insulating adhesive, and
prior to a predetermined reflow process, the control device:
calculates an area of an overlap region between:
an expected placement region of an electrode portion of the electronic component that is mounted on the solders, and
the adhesive, and
determines successful or failed soldering based on the calculated area.

5. The substrate inspection device according to claim 1, wherein
the predetermined condition is that a ratio of a range occupied by a region other than an actual solder region to the actual inspection reference information exceeds a predetermined threshold.

6. The substrate inspection device according to claim 1, wherein
the predetermined condition is that a ratio of a range occupied by a region other than an actual adhesive region to the ideal adhesive inspection reference information exceeds a predetermined threshold.

7. The substrate inspection device according to claim 1, wherein
the predetermined condition is that an area of a region where an actual solder region overlap with an actual adhesive region exceeds a predetermined threshold.

8. A substrate inspection device that is placed on an upstream side of a component mounting machine that mounts an electronic component on solder that is printed on a substrate by a solder printing machine, and that inspects a thermosetting adhesive applied on the substrate, the substrate inspection device comprising:
a mounting table that comprises a motor and that can move the substrate placed on the mounting table in a horizontal direction;
an illumination device that irradiates the solder and the adhesive on the substrate with light;
an imaging device that takes an image of the irradiated solder and the irradiated adhesive and outputs the image; and
a control device that is electrically connected to and controls the motor, the illumination device, and the imaging device, and is configured to:
generate actual solder position information of a solder group that includes two or more solders and on which the electronic component is mounted based on the image, received from the imaging device, that was taken while the mounting table is moving the substrate, and ideal adhesive inspection reference information indicating a reference inspection position and/or a reference inspection range of the adhesive, wherein the ideal adhesive inspection reference information is based on design data or manufacturing data stored in a storage, and the adhesive has a curing temperature higher than a melting temperature of the solders,
output, to the component mounting machine and as mounting position adjustment information, information based on an amount of positional misalignment and a direction of positional misalignment of the actual solder position information relative to ideal solder position information, and
inspect the adhesive based on the ideal adhesive inspection reference information, wherein
the ideal solder position information indicates a position of the solder group included in the design data or in the manufacturing data,
the mounting position adjustment information indicates an amount of positional misalignment and a direction of positional misalignment of an expected mounting position information, and
the expected mounting position information indicates an expected mounting position of the electronic component, relative to an ideal mounting position information indicating an ideal mounting position of the electronic component that is to be mounted on the solder group.

9. The substrate inspection device according to claim 8, wherein
the adhesive is an insulating adhesive, and
prior to a predetermined reflow process, the control device:
calculates an area of an overlap region between each of the solders and the adhesive, and
determines successful or failed soldering based on the calculated area.

10. The substrate inspection device according to claim 9, wherein
the adhesive is an insulating adhesive, and
prior to a predetermined reflow process, the control device:
calculates an area of an overlap region between:
an expected placement region of an electrode portion of the electronic component that is mounted on the solders, and
the adhesive, and
determines successful or failed soldering based on the calculated area.

11. The substrate inspection device according to claim 8, wherein
the adhesive is an insulating adhesive, and
prior to a predetermined reflow process, the control device:
calculates an area of an overlap region between:
an expected placement region of an electrode portion of the electronic component that is mounted on the solders, and
the adhesive, and
determines successful or failed soldering based on the calculated area.

* * * * *